US012660159B2

(12) United States Patent
Chae et al.

(10) Patent No.: US 12,660,159 B2
(45) Date of Patent: Jun. 16, 2026

(54) SEMICONDUCTOR DEVICES

(71) Applicant: SAMSUNG ELECTRONICS CO., LTD., Suwon-si (KR)

(72) Inventors: Hongsik Chae, Suwon-si (KR); Taekyun Kim, Suwon-si (KR); Jin-Su Lee, Hwaseong-si (KR); Hyo-Sun Min, Suwon-si (KR); Hyungsuk Jung, Suwon-si (KR); Jaehyoung Choi, Hwaseong-si (KR); Donguk Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 511 days.

(21) Appl. No.: 17/952,386

(22) Filed: Sep. 26, 2022

(65) Prior Publication Data

US 2023/0217647 A1    Jul. 6, 2023

(30) Foreign Application Priority Data

Jan. 4, 2022    (KR) ........................ 10-2022-0000938

(51) Int. Cl.
*H10B 12/00* (2023.01)
*H10D 1/68* (2025.01)

(52) U.S. Cl.
CPC ........... *H10B 12/315* (2023.02); *H10D 1/716* (2025.01)

(58) Field of Classification Search
None
See application file for complete search history.

(56) References Cited

U.S. PATENT DOCUMENTS

| | | | |
|---|---|---|---|
| 7,682,924 B2 | 3/2010 | Bhat et al. | |
| 8,058,126 B2 | 11/2011 | Busch et al. | |
| 8,846,542 B2 | 9/2014 | Shea et al. | |
| 9,111,953 B2 | 8/2015 | Park et al. | |
| 9,240,441 B2 | 1/2016 | Yoon et al. | |
| 10,559,651 B2 | 2/2020 | Chang et al. | |
| 10,943,908 B2 | 3/2021 | Bae et al. | |
| 11,063,050 B2 | 7/2021 | Liao | |
| 11,251,262 B2 | 2/2022 | Hsiao et al. | |
| 2009/0212338 A1* | 8/2009 | Benson ............... | H10B 12/033 257/306 |

(Continued)

FOREIGN PATENT DOCUMENTS

| | | |
|---|---|---|
| KR | 10-2010-0104287 A | 9/2010 |
| KR | 10-2016-0148114 A | 12/2016 |

(Continued)

*Primary Examiner* — Steven M Page
(74) *Attorney, Agent, or Firm* — Morgan, Lewis & Bockius LLP

(57) ABSTRACT

A semiconductor device includes bottom electrodes on a substrate. A supporting pattern is disposed between the bottom electrodes in a plan view. A top electrode covers the bottom electrodes and the supporting pattern. A dielectric layer is disposed between the bottom electrodes and the top electrode and between the supporting pattern and the top electrode. A capping pattern is interposed between the bottom electrodes and the dielectric layer and between the supporting pattern and the dielectric layer. The capping pattern covers at least a portion of a side surface of the supporting pattern and extends to cover a top surface of the supporting pattern and top surfaces of the bottom electrodes.

19 Claims, 19 Drawing Sheets

(56)　　　　　　References Cited

U.S. PATENT DOCUMENTS

| 2010/0127317 | A1 |  | 5/2010 | Yamazaki |  |
|---|---|---|---|---|---|
| 2013/0078782 | A1 |  | 3/2013 | Bae |  |
| 2015/0060970 | A1 | * | 3/2015 | Sasaki | H10D 1/716 |
|  |  |  |  |  | 257/532 |
| 2016/0365409 | A1 | * | 12/2016 | Lee | H10D 1/716 |
| 2019/0273130 | A1 |  | 9/2019 | Yoon et al. |  |
| 2020/0006345 | A1 | * | 1/2020 | Choo | H10D 1/716 |
| 2020/0176556 | A1 |  | 6/2020 | Lee et al. |  |
| 2020/0312948 | A1 |  | 10/2020 | Kim |  |
| 2020/0395438 | A1 |  | 12/2020 | Kang et al. |  |
| 2021/0202486 | A1 |  | 7/2021 | Kim et al. |  |

FOREIGN PATENT DOCUMENTS

| TW | 202013483 | 4/2020 |
|---|---|---|
| TW | 202114076 | 4/2021 |
| TW | 202121653 | 6/2021 |
| TW | 202137416 | 10/2021 |

* cited by examiner

SEMICONDUCTOR DEVICES

CROSS-REFERENCE TO RELATED APPLICATIONS

This application claims priority under 35 U.S.C. § 119 to Korean Patent Application No. 10-2022-0000938, filed on Jan. 4, 2022 in the Korean Intellectual Property Office, the disclosure of which is incorporated by reference in its entirety herein.

1. TECHNICAL FIELD

The present disclosure relates to a semiconductor device, and in particular, to a semiconductor memory device including a capacitor.

2. DISCUSSION OF RELATED ART

Semiconductor devices have become increasingly popular elements in the electronics industry due to their small-sized, multifunctionality, and low-cost characteristics. Semiconductor devices include semiconductor memory devices for storing data, semiconductor logic devices for processing data, and hybrid semiconductor devices including both of memory and logic elements.

In view of the recent trend of high speed and low power consumption of electronic devices, semiconductor devices in the electronic devices are being developed to provide high operating speeds and/or low operating voltages. Accordingly, there is a demand for increased integration density of the semiconductor device. However, as the integration density of the semiconductor device increases, the semiconductor device may suffer from deterioration in electric characteristics and production yield. Accordingly, many studies are being conducted to increase the electric characteristics and production yield of the semiconductor device.

SUMMARY

An embodiment of the present inventive concept provides a semiconductor device with increased electric characteristics.

An embodiment of the present inventive concept provides a semiconductor device that can be fabricated with a high production yield.

According to an embodiment of the present inventive concept, a semiconductor device includes bottom electrodes on a substrate. A supporting pattern is disposed between the bottom electrodes in a plan view. A top electrode covers the bottom electrodes and the supporting pattern. A dielectric layer is disposed between the bottom electrodes and the top electrode and between the supporting pattern and the top electrode. A capping pattern is interposed between the bottom electrodes and the dielectric layer and between the supporting pattern and the dielectric layer. The capping pattern covers at least a portion of a side surface of the supporting pattern and extends to cover a top surface of the supporting pattern and top surfaces of the bottom electrodes.

According to an embodiment of the present inventive concept, a semiconductor device includes bottom electrodes on a substrate. A supporting pattern is disposed between the bottom electrodes in a plan view. A top electrode covers the bottom electrodes and the supporting pattern. A dielectric layer is disposed between the bottom electrodes and the top electrode and between the supporting pattern and the top electrode. A capping pattern is interposed between top surfaces of the bottom electrodes and the dielectric layer and between a top surface of the supporting pattern and the dielectric layer. The top surfaces of the bottom electrodes are positioned at a height that is lower than the top surface of the supporting pattern.

According to an embodiment of the present inventive concept, a semiconductor device includes a substrate including an active pattern. An impurity region is arranged in the active pattern. A word line is disposed in the substrate. The word line extends to cross the active pattern. A bit line is disposed on the substrate. The bit line extends in a direction that crosses the word line. A storage node contact is disposed on the substrate. The storage node contact is electrically connected to the impurity region. A landing pad is electrically connected to the storage node contact. A bottom electrode is electrically connected to the landing pad. An upper supporting pattern and a lower supporting pattern are disposed between the bottom electrode and an adjacent bottom electrode in a plan view. A top electrode covers the bottom electrode and the upper supporting pattern. A dielectric layer is disposed between the bottom electrode and the top electrode and between the upper supporting pattern and the top electrode. A capping pattern is interposed between a top surface of the bottom electrode and the dielectric layer and between a top surface of the upper supporting pattern and the dielectric layer. The capping pattern covers at least a portion of a side surface of the upper supporting pattern and extends to cover the top surface of the upper supporting pattern and the top surface of the bottom electrode.

DETAILED DESCRIPTION OF EMBODIMENTS

Example embodiments of the present inventive concept will now be described more fully with reference to the accompanying drawings, in which example embodiments are shown.

Figure 1:
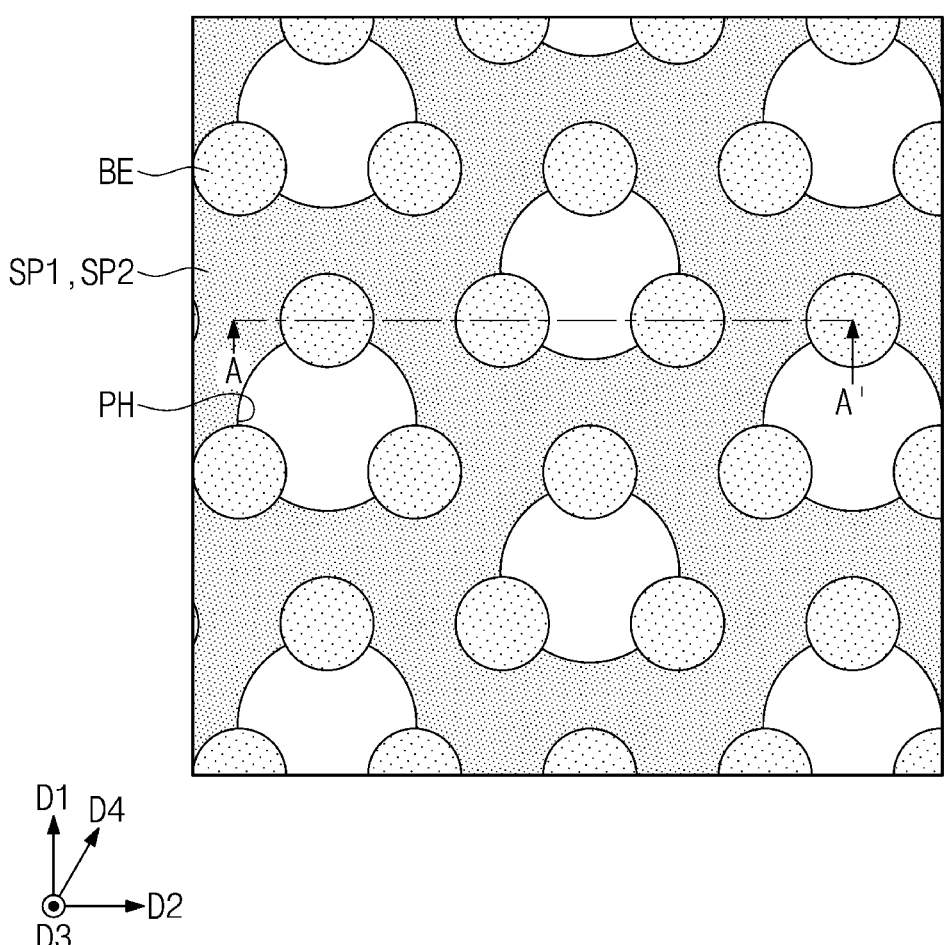
FIG. 1 is a plan view illustrating a semiconductor device according to an embodiment of the present inventive concept.
Figure 2:
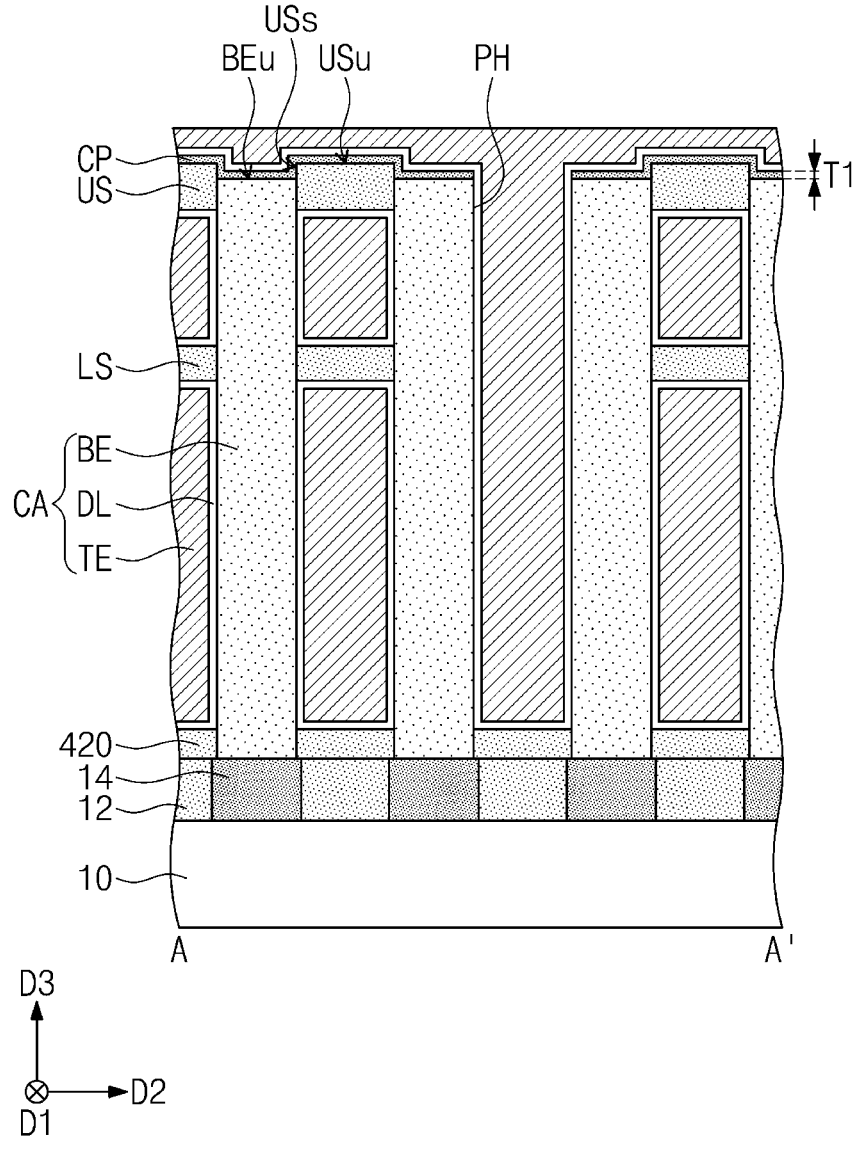
FIGS. 2 and 3 are cross-sectional views taken along line A-A' of FIG. 1 according to embodiments of the present inventive concept.

FIG. 1 is a plan view illustrating a semiconductor device according to an embodiment of the inventive concept. FIG. 2 is a cross-sectional view taken along line A-A' of FIG. 1.

Referring to FIGS. 1 and 2, a substrate 10 may be provided. The substrate 10 may be a semiconductor substrate. For example, in an embodiment the substrate 10 may be a silicon substrate, a germanium substrate, or a silicon-germanium substrate.

An interlayer insulating layer 12 may be disposed on the substrate 10. The interlayer insulating layer 12 may cover at least a portion of a top surface of the substrate 10. As an example, in an embodiment, the interlayer insulating layer 12 may be formed of or include at least one of silicon nitride, silicon oxide, or silicon oxynitride. However, embodiments of the present inventive concept are not necessarily limited thereto. As another example, the interlayer insulating layer 12 may include an empty region.

Conductive contacts 14 may be disposed in the interlayer insulating layer 12. The conductive contacts 14 may be spaced apart from each other in a first direction D1 and a second direction D2, which are parallel to the top surface of the substrate 10 and cross each other. For example, in an embodiment, the first and second directions D1, D2 may be perpendicular to each other. In an embodiment, each of the conductive contacts 14 may be formed of or include at least one of doped semiconductor materials (e.g., poly silicon), metal-semiconductor compound materials (e.g., tungsten silicide), conductive metal nitride materials (e.g., titanium nitride, tantalum nitride, and tungsten nitride), or metallic materials (e.g., titanium, tungsten, and tantalum). The conductive contacts 14 may be electrically connected to impurity regions (e.g., source/drain terminals), which are formed in the substrate 10.

An etch stop pattern 420 may be disposed on the interlayer insulating layer 12 (e.g., disposed directly thereon in a third direction D3 perpendicular to the top surface of the substrate 10). The etch stop pattern 420 may cover the interlayer insulating layer 12 and may expose the conductive contacts 14. In an embodiment, the etch stop pattern 420 may be formed of or include at least one of silicon oxide, SiCN, or SiBN.

Bottom electrodes BE may be disposed on the conductive contacts 14 (e.g., disposed directly thereon in the third direction D3). The bottom electrodes BE may be arranged to penetrate the etch stop pattern 420 and may be electrically connected to the conductive contacts 14, respectively. In an embodiment, each of the bottom electrodes BE may have a pillar shape. In an embodiment, each of the bottom electrodes BE may have a cylinder shape with a closed bottom surface.

The bottom electrodes BE may be spaced apart from each other in the first and second directions D1 and D2. For example, in an embodiment the bottom electrodes BE may be arranged in a honeycomb shape, when viewed in a plan view. Each of the bottom electrodes BE may be positioned at the center of a hexagon defined by other six bottom electrodes BE. The bottom electrodes BE may be formed of or include at least one of conductive materials. For example, in an embodiment the bottom electrodes BE may be formed of or include at least one of metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO($SrRuO_3$), BSRO(($Ba,Sr)RuO_3$), CRO($CaRuO_3$), and LSCo), or metal silicide materials. However, embodiments of the present inventive concept are not necessarily limited thereto.

An upper supporting pattern US and a lower supporting pattern LS may be disposed on the substrate 10. The upper and lower supporting patterns US and LS may be spaced apart from each other in the third direction D3. The upper supporting pattern US may be positioned at a height higher than the lower supporting pattern LS. In an embodiment, additional supporting patterns, which are spaced apart from each other in the third direction D3, may be further provided, and in this embodiment, the uppermost one of the supporting patterns may be referred to as the upper supporting pattern US. The upper and lower supporting patterns US and LS may be provided between the bottom electrodes BE. The upper and lower supporting patterns US and LS may be in direct contact with side surfaces of the bottom electrodes BE and may enclose the side surfaces of the bottom electrodes BE. The upper and lower supporting patterns US and LS may physically support the bottom electrodes BE. The upper and lower supporting patterns US and LS may be in direct contact with sidewalls of the bottom electrodes BE, which are adjacent to each other. A thickness of the upper supporting pattern US in the third direction D3 may be different from a thickness of the lower supporting pattern LS in the third direction D3. In an embodiment, each of the upper and lower supporting patterns US and LS may be formed of or include at least one of silicon nitride, SiBN, or SiCN. However, embodiments of the present inventive concept are not necessarily limited thereto.

Top surfaces BEu of the bottom electrodes BE may be located at a height lower than a top surface USu of the upper supporting pattern US. As an example, the top surfaces BEu of the bottom electrodes BE may be positioned at a height that is lower than the top surface USu of the upper supporting pattern US and is higher than a bottom surface of the upper supporting pattern US. A side surface USs of the upper supporting pattern US may have an exposed portion (e.g., an upper portion in the third direction D3) that is not covered with the bottom electrodes BE. A remaining portion of the side surface USs of the upper supporting pattern US may be in direct contact with the side surfaces of the bottom electrodes BE. The top surfaces BEu of the bottom electrodes BE may be positioned at a height higher than a top surface of the lower supporting pattern LS.

A capping pattern CP may be disposed on the upper supporting pattern US and the bottom electrodes BE. The capping pattern CP may cover the exposed portion of the side surface USs of the upper supporting pattern US which is not covered with the bottom electrodes BE. In addition, the capping pattern CP may extend to cover the top surface USu of the upper supporting pattern US and the top surfaces BEu of the bottom electrodes BE. For example, the capping pattern CP may be arranged to cover the exposed portion of the side surface USs of the upper supporting pattern US and may extend to cover the top surface USu of the upper supporting pattern US and the top surfaces BEu of the bottom electrodes BE. When viewed in a plan view, the bottom electrodes BE and the upper supporting pattern US may be overlapped with the capping pattern CP. For example, the bottom electrodes BE and the upper supporting pattern US are vertically overlapped with the capping pattern CP.

In an embodiment, the capping pattern CP may be formed of or include a material having an etch selectivity with respect to the bottom electrodes BE. For example, the capping pattern CP may be formed of or include a material that has an etch selectivity with respect to a mold layer (e.g., silicon oxide), which will be described with reference to FIG. 4. As an example, the capping pattern CP may be formed of or include at least one of silicon nitride, polysilicon, or SiCN. However, embodiments of the present inventive concept are not necessarily limited thereto. A thickness T1 of the capping pattern CP in the third direction D3 may be in a range from about 1 nm to about 50 nm.

Penetration holes PH may be formed between the bottom electrodes BE, which are adjacent to each other. As an example, in an embodiment each of the penetration holes PH may have a circular shape and may be disposed between three adjacent ones of the bottom electrodes BE to expose a portion of a side surface of each of the three bottom electrodes BE. However, embodiments of the present inventive concept are not necessarily limited thereto, and the penetration holes PH may be provided in various shapes between a plurality of bottom electrodes BE. Each of the penetration holes PH may be provided to penetrate the capping pattern CP and the upper and lower supporting patterns US and LS. Each of the penetration holes PH may be provided to expose the etch stop pattern 420, such as an upper surface of the etch stop pattern 420.

A dielectric layer DL may be disposed on the upper supporting pattern US, the lower supporting pattern LS, the bottom electrodes BE, the etch stop pattern 420, and the capping pattern CP. The dielectric layer DL may conformally cover the upper supporting pattern US, the lower supporting pattern LS, the bottom electrodes BE, the etch stop pattern 420, and the capping pattern CP. The capping pattern CP may be interposed between the top surfaces BEu of the bottom electrodes BE and the dielectric layer DL. In addition, the capping pattern CP may also be interposed between the exposed portion of the side surface USs of the upper supporting pattern US and the dielectric layer DL and between the top surface USu of the upper supporting pattern US and the dielectric layer DL. The dielectric layer DL may be disposed to partially fill the penetration holes PH. The dielectric layer DL is in direct contact with the bottom electrodes BE and may have a crystal structure that is the same as or similar to that of the bottom electrodes BE. For example, in an embodiment the dielectric layer DL may have a tetragonal structure. In an embodiment, the dielectric layer DL may be formed of or include at least one of metal oxide materials (e.g., $HfO_2$, $ZrO_2$, $Al_2O_3$, $La_2O_3$, $Ta_2O_3$, and $TiO_2$) or perovskite dielectric materials (e.g., $SrTiO_3$ (STO), (Ba, Sr)$TiO_3$ (BST), $BaTiO_3$, PZT, and PLZT) and may have a single- or multi-layered structure. However, embodiments of the present inventive concept are not necessarily limited thereto.

A top electrode TE may be disposed on the dielectric layer DL. The top electrode TE may cover the bottom electrodes BE, the upper supporting pattern US, and the lower supporting pattern LS. The top electrode TE may fill remaining portions of the penetration holes PH, spaces between the upper and lower supporting patterns US and LS, and spaces between the lower supporting pattern LS and the etch stop pattern 420. The dielectric layer DL may be interposed between the bottom electrodes BE and the top electrode TE, between the upper supporting pattern US and the top electrode TE, between the lower supporting pattern LS and the top electrode TE, and between the capping pattern CP and the top electrode TE.

In an embodiment, the top electrode TE may be formed of or include at least one of titanium nitride, doped polysilicon, or doped silicon germanium. The top electrode TE may have a single- or multi-layered structure. The bottom electrodes BE, the dielectric layer DL, and the top electrode TE may constitute a capacitor CA. As an example, in an embodiment in which the semiconductor device is a memory device, the capacitor CA may be used as a data storage element of each memory cell.

Figure 3:
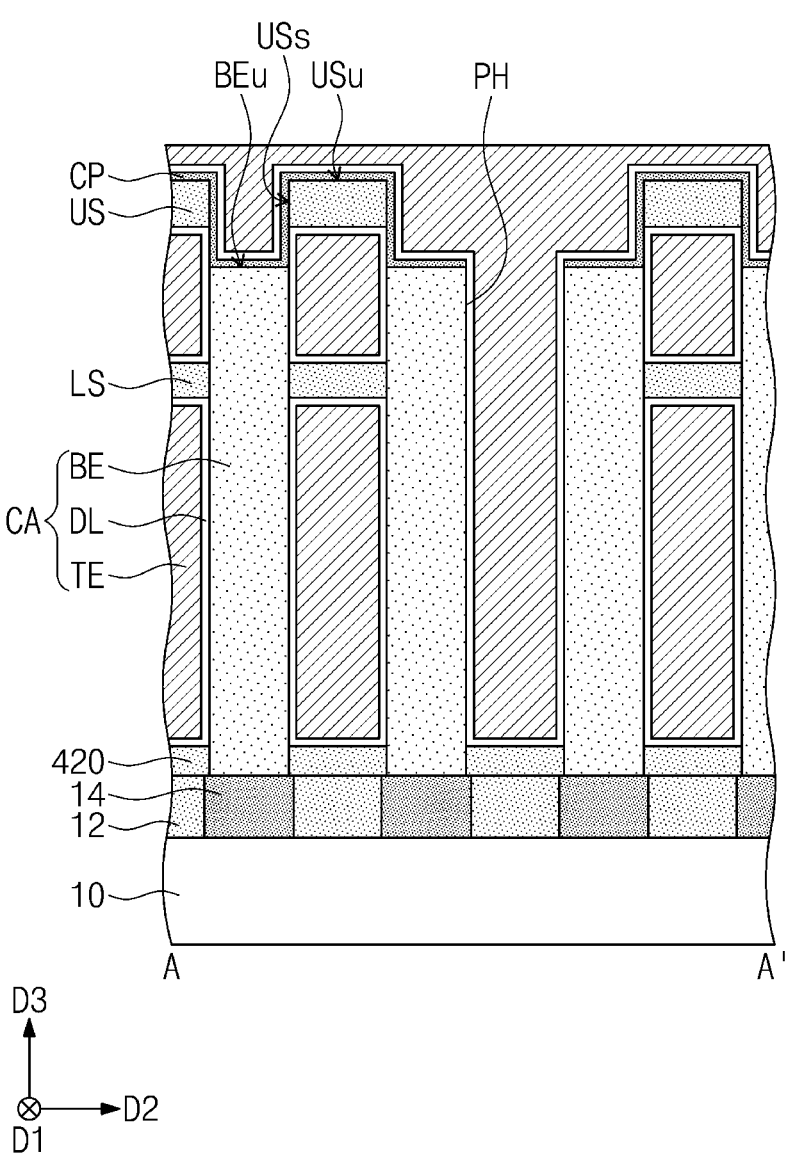

FIG. 3 is a cross-sectional view, which is taken along a line A-A' of FIG. 1 to illustrate a semiconductor device according to an embodiment of the present inventive concept. For concise description, a previously described element may be identified by the same reference number without repeating an overlapping description thereof.

Referring to FIGS. 1 and 3, the upper and lower supporting patterns US and LS may be disposed on the substrate 10. When viewed in a plan view, the upper and lower supporting patterns US and LS may be disposed between the bottom electrodes BE. The top surfaces BEu of the bottom electrodes BE may be positioned at a height that is lower than the bottom surface of the upper supporting pattern US and may be positioned at a height that is higher than a top surface of the lower supporting pattern LS. For example, the upper supporting pattern US may be vertically spaced apart from the bottom electrodes BE and may not be in direct contact with the side surfaces of the bottom electrodes BE.

In an embodiment, the capping pattern CP may cover the entire side surface USs of the upper supporting pattern US. For example, the capping pattern CP may directly cover the entire lateral side surfaces of the upper supporting pattern US and the upper surface of the upper supporting pattern US. The capping pattern CP may be extended from the side surface USs of the upper supporting pattern US to the top surfaces BEu of the bottom electrodes BE, which are vertically spaced apart from the upper supporting pattern US. The capping pattern CP on the side surface USs of the upper supporting pattern US may be interposed between the upper supporting pattern US and the dielectric layer DL. The capping pattern CP, which is disposed between the upper supporting pattern US and the bottom electrodes BE, may be enclosed by the dielectric layer DL. In an embodiment, the capping pattern CP may be further extended to the top surface USu of the upper supporting pattern US. The capping pattern CP may be in direct contact with the side surface USs of the upper supporting pattern US and the top surfaces BEu of the bottom electrodes BE. Thus, although the upper supporting pattern US is spaced apart from the bottom electrodes BE, a supporting force from the upper supporting pattern US may be exerted on the bottom electrodes BE through the capping pattern CP.

FIGS. 4 to 11 are cross-sectional views illustrating a method of fabricating the semiconductor device of FIG. 2, and hereinafter, the method of fabricating the semiconductor device of FIG. 2 will be described in more detail with reference to FIGS. 4 to 11. For concise description, a previously described element may be identified by the same reference number without repeating an overlapping description thereof.

Figure 4:
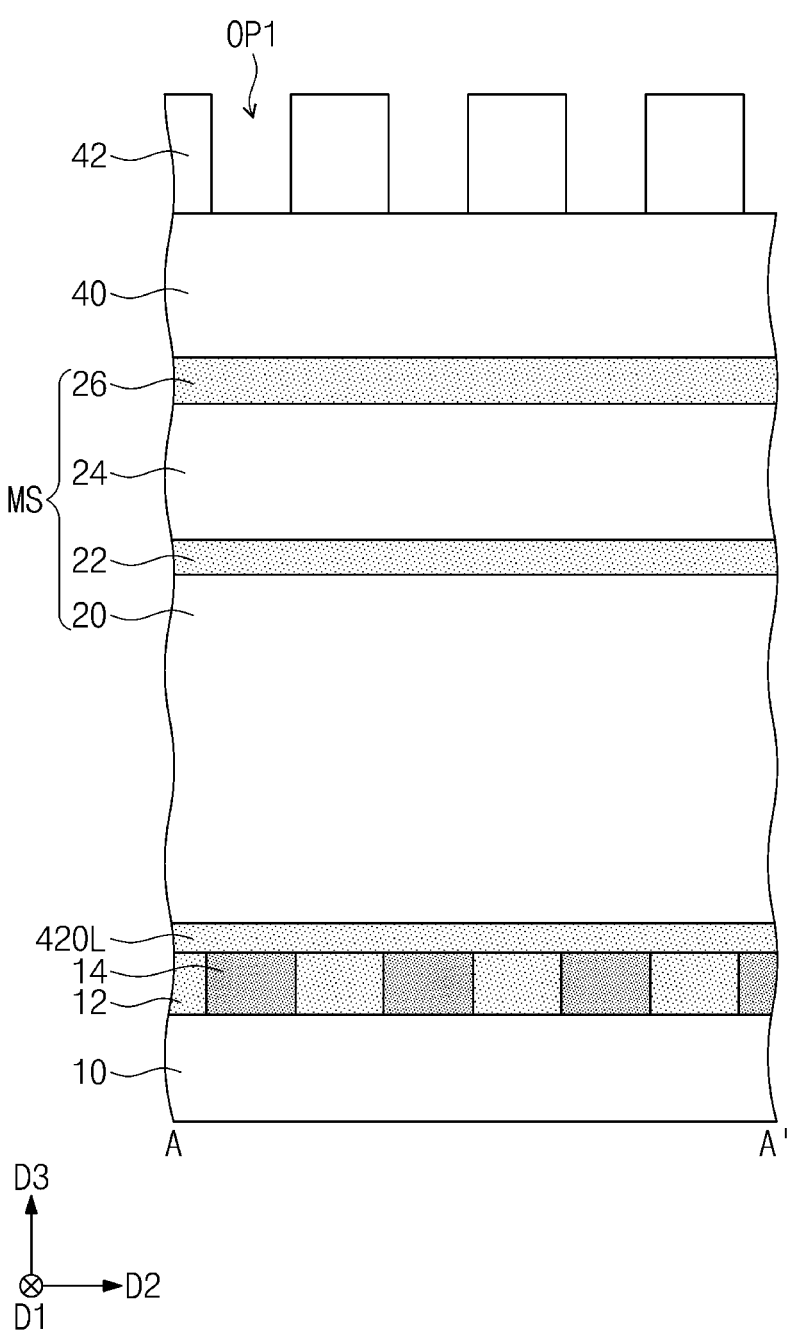
FIGS. 4 to 11 are cross-sectional views taken along line A-A' of FIG. 1 illustrating a method of fabricating a semiconductor device of FIG. 2 according to embodiments of the present inventive concept.

Referring to FIG. 4, the substrate 10 may be provided. The interlayer insulating layer 12 may be formed on the substrate 10 (e.g., formed directly thereon in the third direction D3). The conductive contacts 14 may be formed in the interlayer insulating layer 12 (e.g., formed directly thereon in the third direction D3). An etch stop layer 420L may be formed on the substrate 10 (e.g., formed directly thereon in the third direction D3). The etch stop layer 420L may be formed to cover a top surface of the interlayer insulating layer 12 and top surfaces of the conductive contacts 14.

A mold structure MS may be formed on the etch stop layer 420L. The mold structure MS may include mold layers and supporting layers, which are alternately stacked on the etch stop layer 420L (e.g., in the third direction D3). As an example, the mold structure MS may include a first mold layer 20, a lower supporting layer 22, a second mold layer 24, and an upper supporting layer 26, which are sequentially stacked. However, embodiments of the present inventive concept are not necessarily limited thereto and the number of layers of the mold structure MS may vary. In an embodiment, the lower supporting layer 22 may be formed of or include a material having an etch selectivity with respect to the first mold layer 20. The upper supporting layer 26 may be formed of or include a material having an etch selectivity with respect to the second mold layer 24. In an embodiment, the first and second mold layers 20 and 24 may be formed of or include the same material. As an example, the first and second mold layers 20 and 24 may be formed of or include silicon oxide. The lower and upper supporting layers 22 and 26 may be formed of or include the same material. As an example, the lower and upper supporting layers 22 and 26 may be formed of or include at least one of silicon nitride, SiBN, or SiCN.

A first mask layer 40 and a second mask pattern 42 may be sequentially formed on the mold structure MS (e.g., in the third direction D3). The first mask layer 40 may cover the upper supporting layer 26. In an embodiment, the first mask layer 40 may be formed of or include at least one of polysilicon, silicon nitride, or silicon oxynitride. However, embodiments of the present inventive concept are not necessarily limited thereto. The second mask pattern 42 may be formed on the first mask layer 40 and may have first openings OP1. The first openings OP1 may be formed to expose portions of a top surface of the first mask layer 40. In an embodiment, the second mask pattern 42 may be formed of or include at least one of spin-on-hardmask (SOH) materials or amorphous carbon layer (ACL). However, embodiments of the present inventive concept are not necessarily limited thereto.

Figure 5:
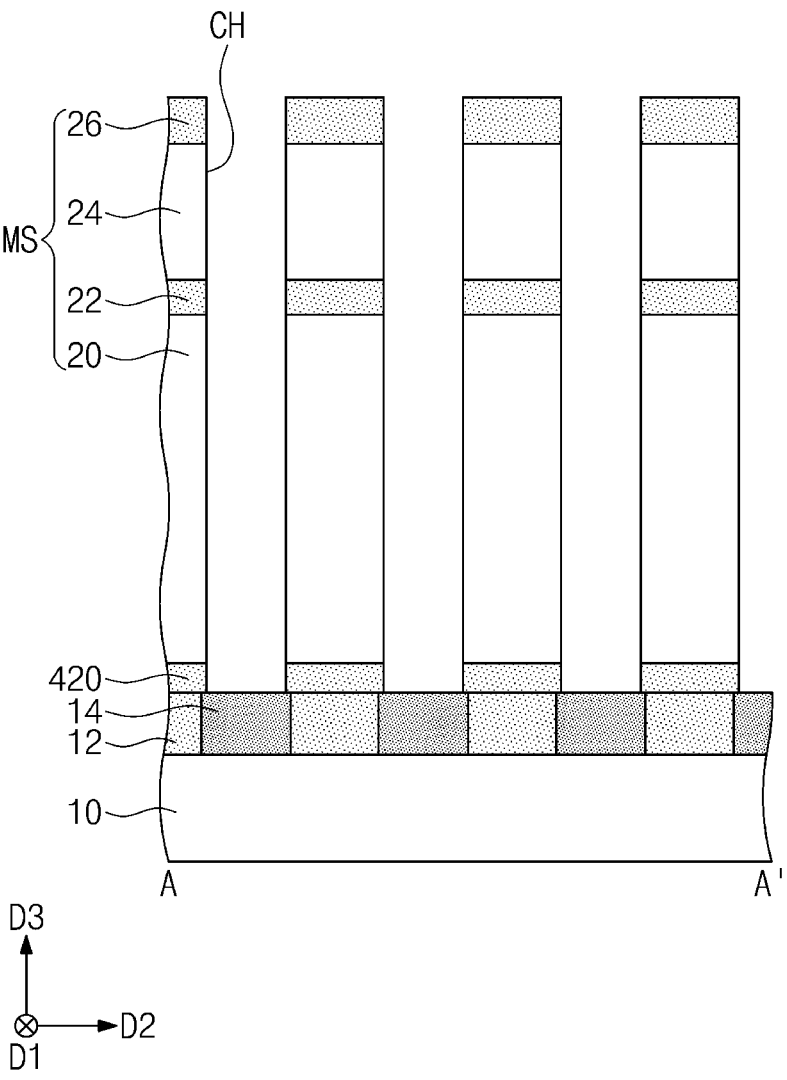

Referring to FIG. 5, the first mask layer 40, the mold structure MS, and the etch stop layer 420L may be anisotropically etched using the second mask pattern 42 as an etch mask. Accordingly, conductive holes CH may be formed to have a substantially same shape as the first openings OP1, when viewed in a plan view. The conductive holes CH may be formed to penetrate the mold structure MS and the etch stop layer 420L in the third direction D3 and to expose the top surfaces of the conductive contacts 14. After the etching process, an unetched portion of the etch stop layer 420L may be used as the etch stop pattern 420. In an embodiment, the first mask layer 40 and the second mask pattern 42 may be removed through the etching process. Alternatively, the first mask layer 40 and the second mask pattern 42 may be removed by an additional removing process which is performed after the etching process.

Figure 6:
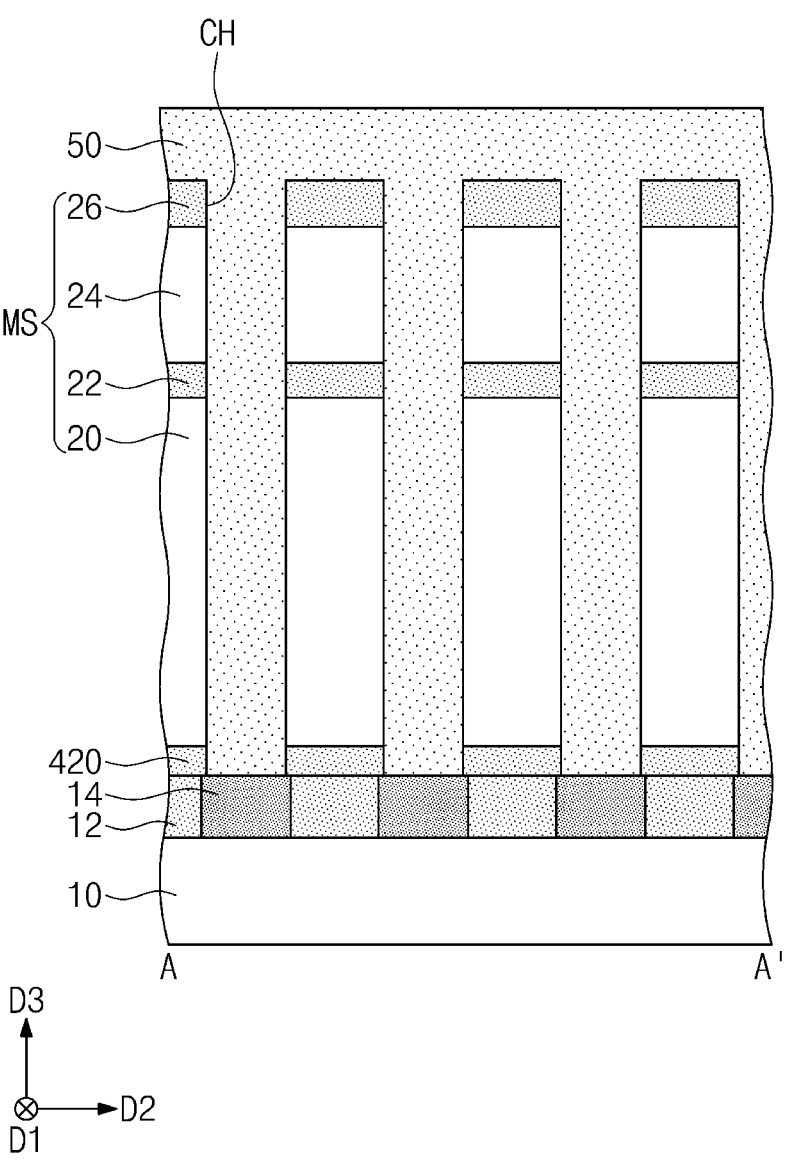

Referring to FIG. 6, a bottom electrode layer 50 may be formed on the mold structure MS to fill the conductive holes CH. The bottom electrode layer 50 may cover the upper supporting layer 26 and the exposed top surfaces of the conductive contacts 14. In an embodiment, the bottom electrode layer 50 may be formed by a deposition technique having a good step coverage property. As an example, the bottom electrode layer 50 may be formed by a chemical vapor deposition (CVD) process or an atomic layer deposition (ALD) process. However, embodiments of the present inventive concept are not necessarily limited thereto.

As an example, the bottom electrode layer 50 may be formed to fully fill the conductive holes CH. However, embodiments of the present inventive concept are not necessarily limited thereto. For example, in an embodiment the bottom electrode layer 50 may be formed to conformally cover an inner surface of each of the conductive holes CH and a top surface of the mold structure MS. In an embodiment, the bottom electrode layer 50 may be formed of or include at least one of metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO($SrRuO_3$), BSRO(($Ba,Sr$)$RuO_3$), CRO($CaRuO_3$), and LSCo), or metal silicide materials. However, embodiments of the present inventive concept are not necessarily limited thereto.

Figure 7:
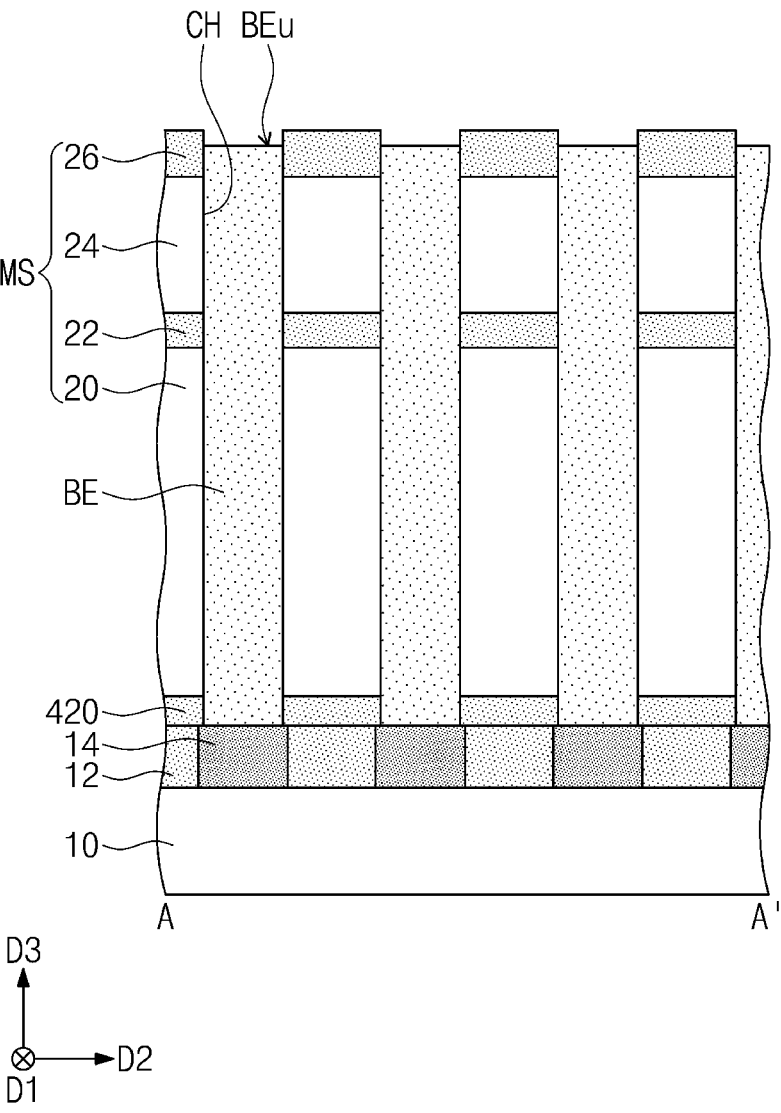

Referring to FIG. 7, an upper portion of the bottom electrode layer 50 may be removed. The remaining portion of the bottom electrode layer 50 after the upper portion is removed may form the bottom electrodes BE filling the conductive holes CH, respectively. For example, in an embodiment the upper portion of the bottom electrode layer 50 may be removed by an etch-back process. The bottom electrodes BE may penetrate the mold structure MS in the third direction D3 and may be electrically connected to the conductive contacts 14, respectively. In an embodiment as shown in FIG. 6 in which the bottom electrode layer 50 is formed to fully fill the conductive holes CH, each of the bottom electrodes BE may be formed to have a pillar shape. In an embodiment in which the bottom electrode layer 50 is formed to conformally cover the inner surface of each of the conductive holes CH and the top surface of the mold structure MS, each of the bottom electrodes BE may be formed to have a cylinder shape with a closed bottom surface.

The top surfaces BEu of the bottom electrodes BE may be positioned at a height lower than a top surface of the upper supporting layer 26. As an example, the top surfaces BEu of the bottom electrodes BE may be positioned at a height that is lower than the top surface of the upper supporting layer 26 and is higher than a bottom surface of the upper supporting layer 26. A side surface of the upper supporting layer 26 may have an exposed portion (e.g., an upper portion in the third direction D3) that is not covered with the bottom electrodes BE. A remaining portion of the side surface of the upper supporting layer 26 may be in direct contact with the side surfaces of the bottom electrodes BE. The top surfaces BEu of the bottom electrodes BE may be positioned at a height that is higher than a top surface of the lower supporting layer 22.

Figure 8:
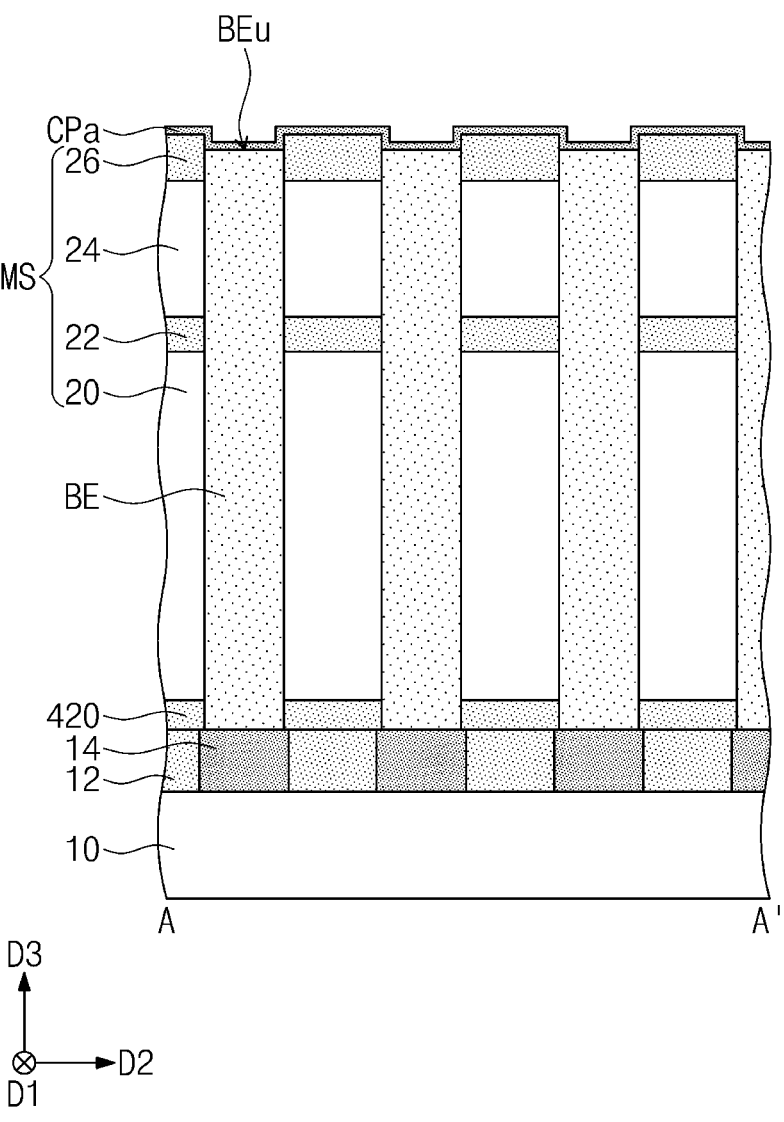

Referring to FIG. 8, a capping layer CPa may be formed on the bottom electrodes BE and the upper supporting layer 26. The capping layer CPa may cover the top surfaces BEu of the bottom electrodes BE and the exposed portions of the top and side surfaces of the upper supporting layer 26. Due to the capping layer CPa, the top surfaces BEu of the bottom electrodes BE may not be exposed to the outside. In an embodiment, the capping layer CPa may be formed of or include a material having an etch selectivity with respect to the bottom electrodes BE, the first mold layer 20, and the second mold layer 24. For example, the capping layer CPa may be formed of or include at least one of, for example, silicon nitride, polysilicon, or SiCN. However, embodiments of the present inventive concept are not necessarily limited thereto. In an embodiment, the capping layer CPa may be formed by a chemical vapor deposition (CVD) process or an atomic layer deposition (ALD) process.

Figure 9:
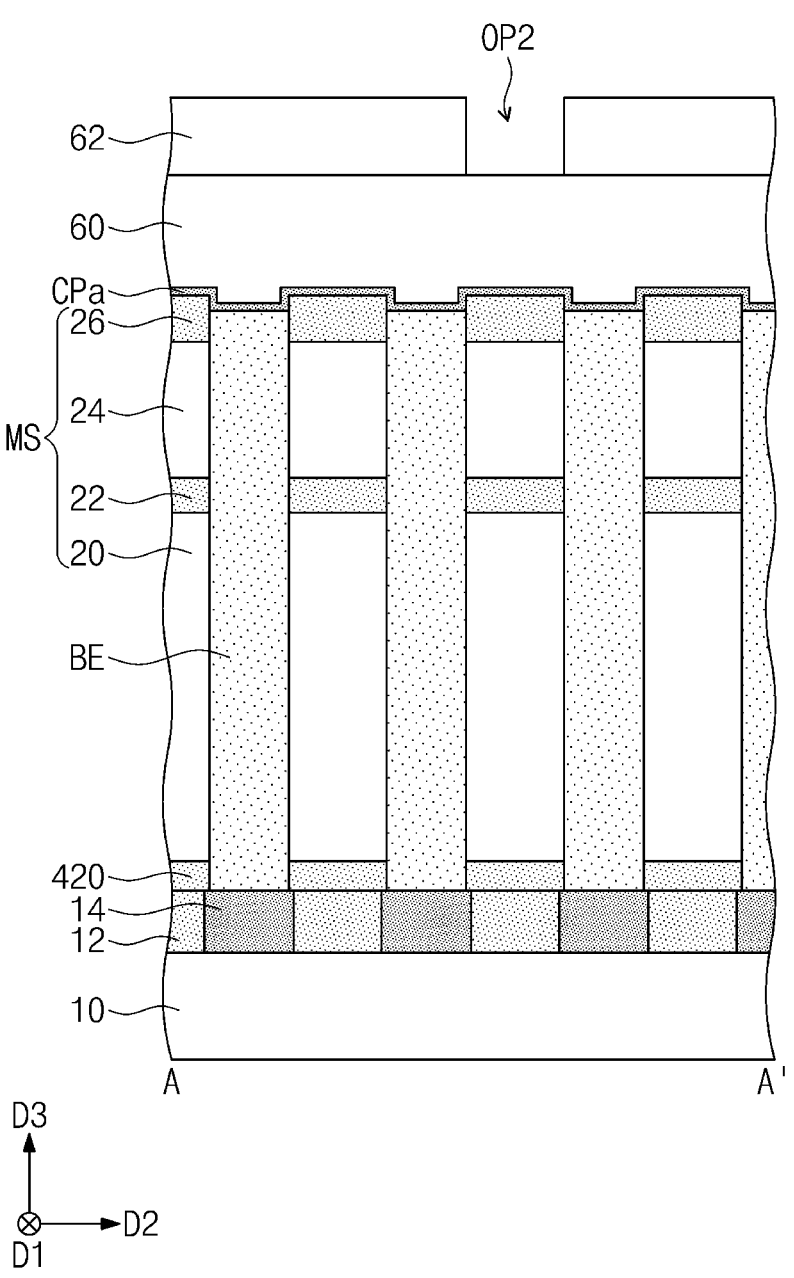

Referring to FIG. 9, a third mask layer 60 and a fourth mask pattern 62 may be sequentially formed on the capping layer CPa (e.g., in the third direction D3). The third mask layer 60 may cover the capping layer CPa. The fourth mask pattern 62 may be formed on the third mask layer 60 and may have second openings OP2. The second openings OP2 may be formed to expose portions of a top surface of the third mask layer 60. In an embodiment, the third mask layer 60 may be formed of or include, for example, polysilicon. In an embodiment, the fourth mask pattern 62 may be formed of or include a photoresist material. However, embodiments of the present inventive concept are not necessarily limited thereto.

Figure 10:
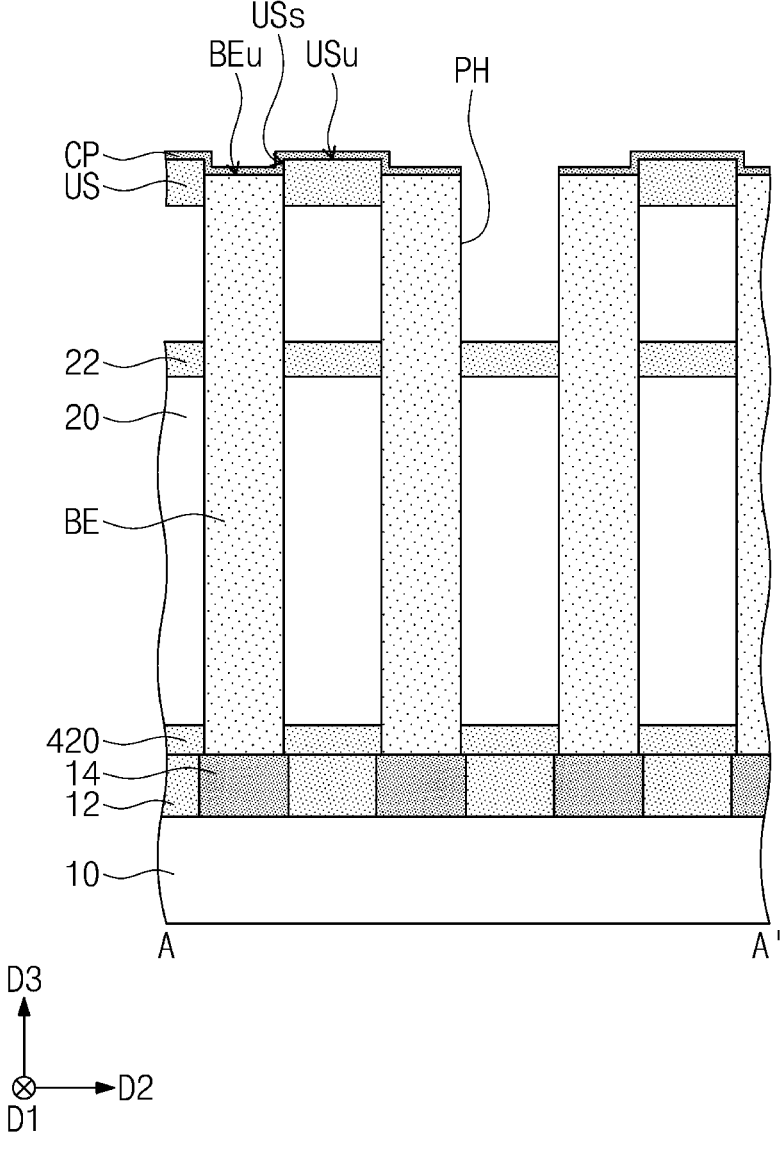

Referring to FIG. 10, the third mask layer 60, the capping layer CPa, and the upper supporting layer 26 may be anisotropically etched using the fourth mask pattern 62 as an etch mask. Accordingly, a portion of the third mask layer 60, a portion of the capping layer CPa, and a portion of the upper supporting layer 26, which are vertically overlapped with the second openings OP2, may be removed. A remaining portion of the capping layer CPa may form the capping pattern CP, and a remaining portion of the upper supporting layer 26 may form the upper supporting pattern US. In addition, the penetration holes PH may be formed to sequentially pass through the capping pattern CP and the upper supporting pattern US. The penetration holes PH may be vertically overlapped with the second openings OP2. In an embodiment, the penetration holes PH may be formed to expose portions of a top surface of the second mold layer 24.

Next, the second mold layer 24 may be removed. Accordingly, the bottom surface of the upper supporting pattern US, portions of the side surfaces of the bottom electrodes BE, and the top surface of the lower supporting layer 22 may be exposed. In an embodiment, the process of removing the second mold layer 24 may include an isotropic etching process. The capping pattern CP, the upper supporting pattern US, and the lower supporting layer 22, which have an etch selectivity with respect to the second mold layer 24, may not be removed during the isotropic etching process. The capping pattern CP may prevent upper portions of the bottom electrodes BE from being removed or damaged by the isotropic etching process. In an embodiment, the isotropic etching process may be performed using phosphoric acid ($H_3PO_4$). As an example, a remaining portion of the third mask layer 60 may be removed before the process of removing the second mold layer 24 is performed. However, embodiments of the present inventive concept are not necessarily limited thereto.

Figure 11:
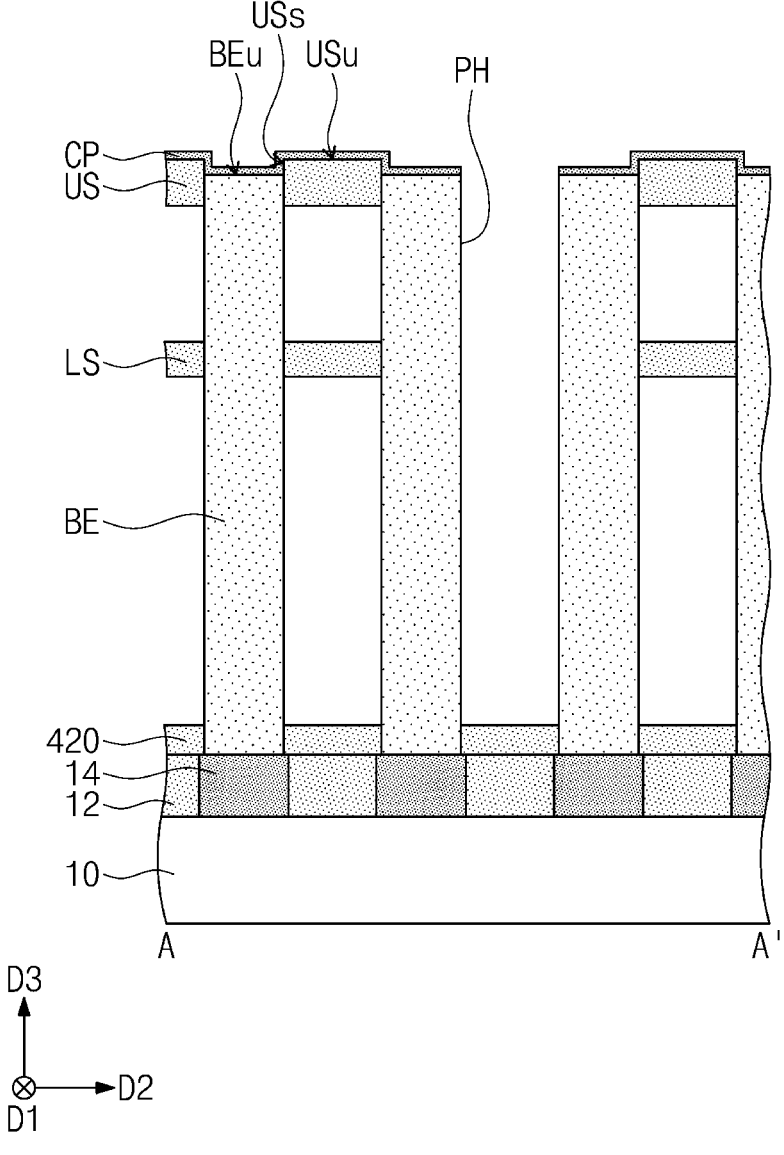

Referring to FIG. 11, portions of the lower supporting layer 22, which are vertically overlapped with the penetration holes PH, may be etched to expose portions of a top surface of the first mold layer 20. A remaining portion of the lower supporting layer 22 may form the lower supporting pattern LS. The penetration holes PH may be extended into the lower supporting pattern LS and may further penetrate the lower supporting pattern LS.

Thereafter, the first mold layer 20 may be removed. Accordingly, a bottom surface of the lower supporting pattern LS, a remaining portion of the side surfaces of the bottom electrodes BE, and a top surface of the etch stop pattern 420 may be exposed. In an embodiment, the process of removing the first mold layer 20 may include an isotropic etching process. The capping pattern CP, the upper supporting pattern US, and the lower supporting pattern LS, which have an etch selectivity with respect to the first mold layer 20, may not be removed during the isotropic etching process. The capping pattern CP may prevent the bottom electrodes BE from being removed or damaged by the isotropic etching process. In an embodiment, the isotropic etching process may be performed using phosphoric acid ($H_3PO_4$).

Referring back to FIG. 2, the dielectric layer DL may be formed on the upper supporting pattern US, the lower supporting pattern LS, the bottom electrodes BE, the etch stop pattern 420, and the capping pattern CP. The dielectric layer DL may be formed to conformally cover the upper supporting pattern US, the lower supporting pattern LS, the bottom electrodes BE, the etch stop pattern 420, and the capping pattern CP. The dielectric layer DL may be formed to partially fill the penetration holes PH. As a result of the formation of the dielectric layer DL, the capping pattern CP may be interposed between the top surfaces BEu of the bottom electrodes BE and the dielectric layer DL, between the top surface USu of the upper supporting pattern US and the dielectric layer DL, and between the exposed portion of the side surface USs of the upper supporting pattern US and the dielectric layer DL.

In an embodiment, the dielectric layer DL which is in direct contact with the bottom electrodes BE may be formed to have a crystal structure that is the same as or similar to that of the bottom electrodes BE. For example, the dielectric layer DL may be formed to have a tetragonal structure. The dielectric layer DL may be formed by a deposition process (e.g., CVD or ALD process) having a good step coverage property.

The top electrode TE may be formed on the dielectric layer DL. The top electrode TE may fill remaining portions of the penetration holes PH and may cover the top surfaces BEu of the bottom electrodes BE. The top electrode TE may be formed to fill spaces between the bottom electrodes BE, between the upper and lower supporting patterns US and LS, and between the lower supporting pattern LS and the etch stop pattern 420. As a result of the formation of the top electrode TE, the dielectric layer DL may be interposed between the bottom electrodes BE and the top electrode TE. The bottom electrodes BE, the dielectric layer DL, and the top electrode TE may constitute the capacitor CA.

FIGS. 12 to 16 are cross-sectional views illustrating a method of fabricating the semiconductor device of FIG. 3, and hereinafter, the method of fabricating the semiconductor device of FIG. 3 will be described in more detail with reference to FIGS. 12 to 16. For concise description, a previously described element may be identified by the same reference number without repeating an overlapping description thereof.

Figure 12:
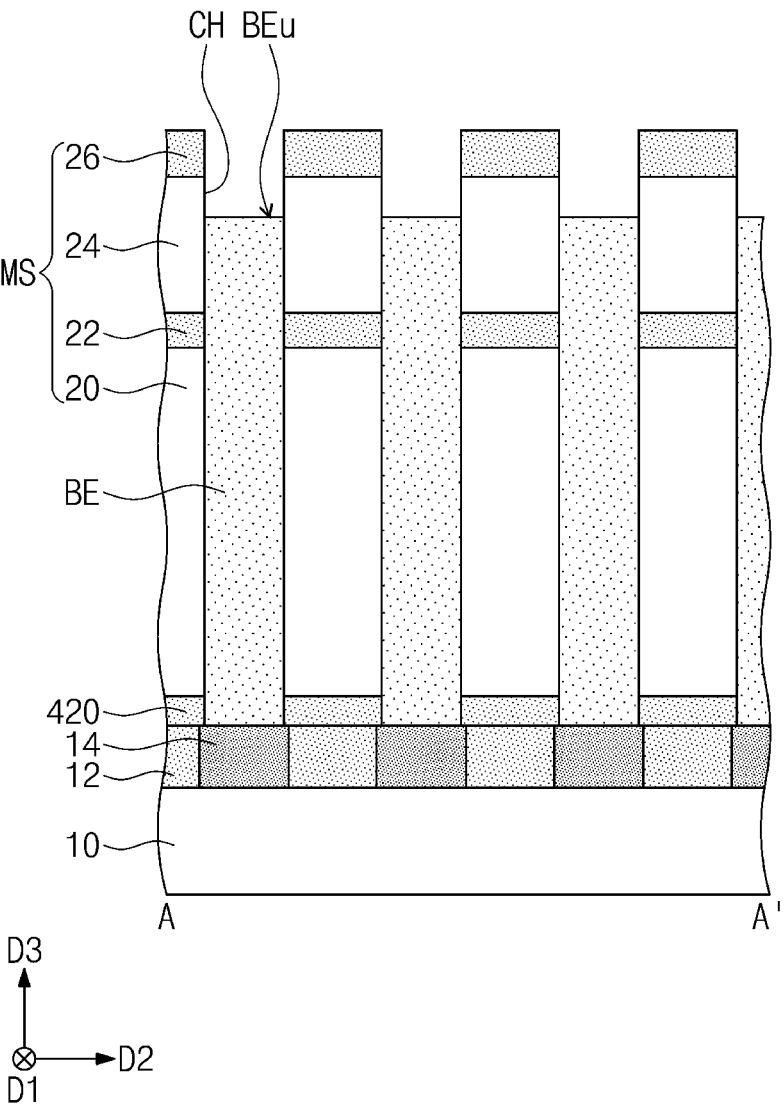
FIGS. 12 to 16 are cross-sectional views taken along line A-A' of FIG. 1 illustrating a method of fabricating a semiconductor device of FIG. 3 according to embodiments of the present inventive concept.

Referring to FIG. 12, an upper portion of the bottom electrode layer 50 of FIG. 6 may be removed. The bottom electrode layer 50 after removal of the upper portion thereof may form the bottom electrodes BE filling the conductive holes CH, respectively. The top surfaces BEu of the bottom electrodes BE may be formed to be positioned at a height lower than the bottom surface of the upper supporting layer 26. For example, the bottom electrodes BE may be formed to be vertically spaced apart from the upper supporting layer 26. The bottom electrodes BE may be formed to expose the entire side surface of the upper supporting layer 26 and a portion of the side surface of the second mold layer 24. The top surfaces BEu of the bottom electrodes BE may be formed to be positioned at a height that is higher than the top surface of the lower supporting layer 22.

Figure 13:
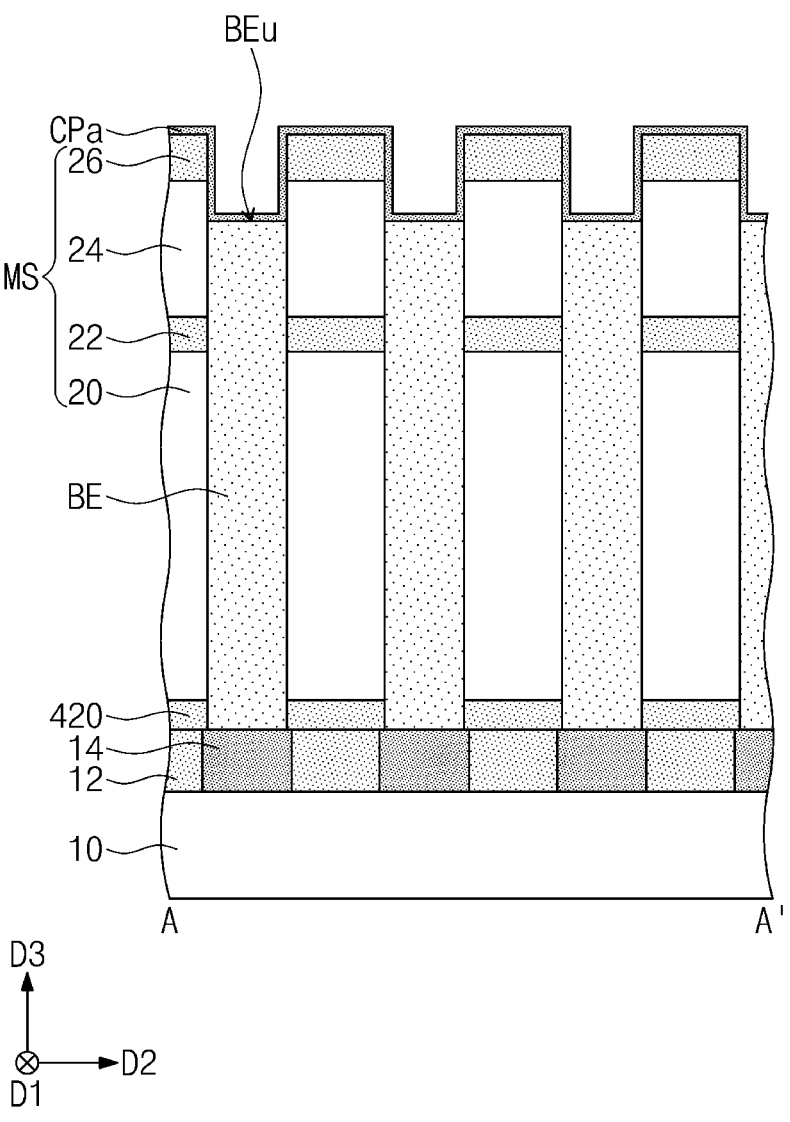

Referring to FIG. 13, the capping layer CPa may be formed on the bottom electrodes BE and the upper supporting layer 26. The capping layer CPa may be formed to cover the side surface of the upper supporting layer 26 and the exposed portion of the side surface of the second mold layer 24 and may be extended to cover the top surface of the upper supporting layer 26 and the top surfaces of the bottom electrodes BE. Due to the capping layer CPa, the top surfaces BEu of the bottom electrodes BE may not be exposed to the outside.

Figure 14:
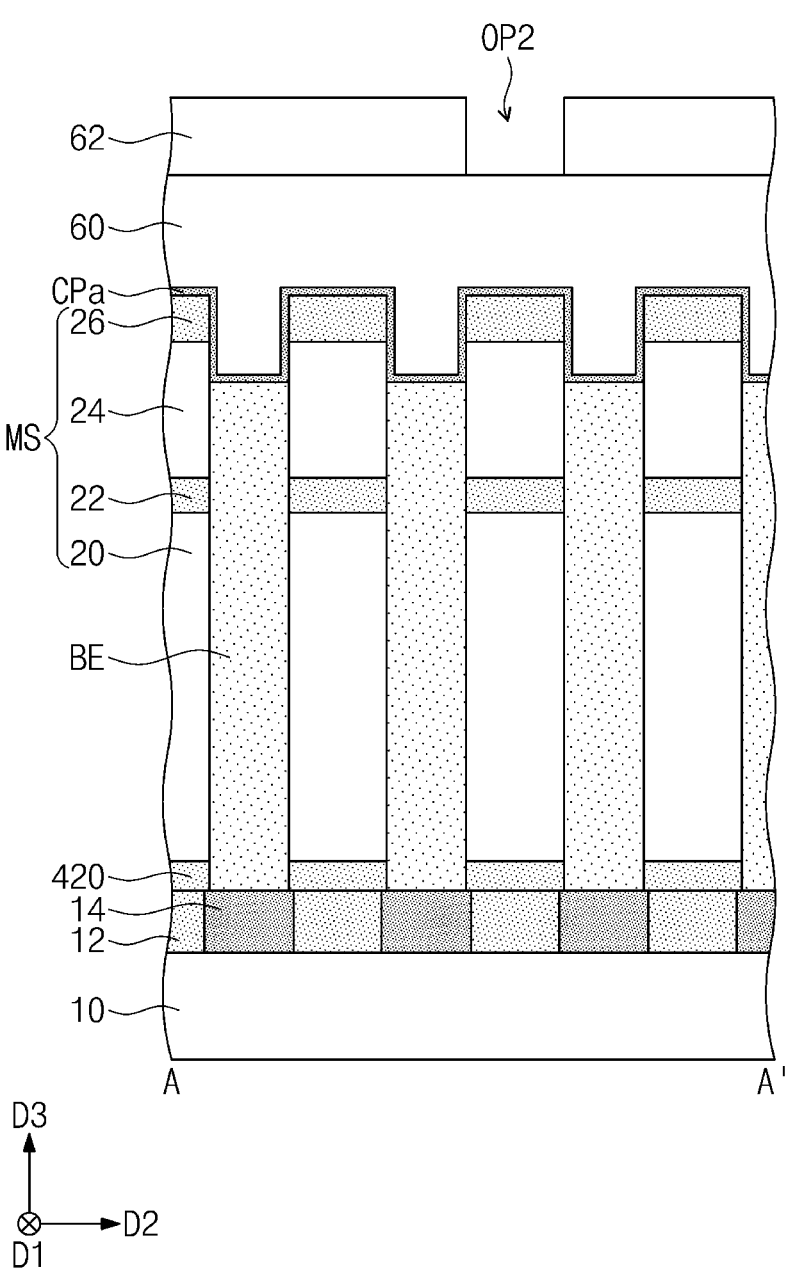

Referring to FIG. 14, the third mask layer 60 and the fourth mask pattern 62 may be sequentially formed on the capping layer CPa (e.g., in the third direction D3). The third mask layer 60 may cover the capping layer CPa. The fourth mask pattern 62 may be formed on the third mask layer 60 and may have the second openings OP2.

Figure 15:
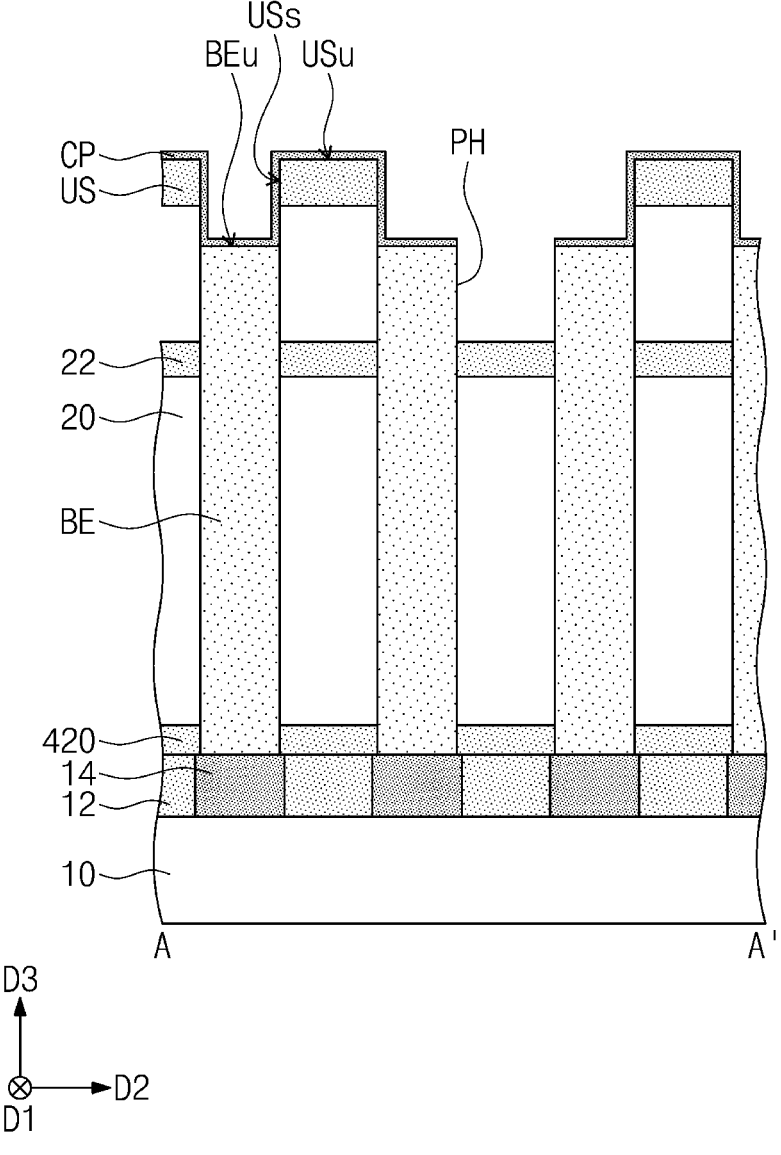

Referring to FIG. 15, in an embodiment the third mask layer 60, the capping layer CPa, and the upper supporting layer 26 may be anisotropically etched using the fourth mask pattern 62 as an etch mask. A remaining portion of the capping layer CPa may form the capping pattern CP, and a remaining portion of the upper supporting layer 26 may form the upper supporting pattern US. In addition, the penetration holes PH may be formed to sequentially pass through the capping pattern CP and the upper supporting pattern US.

Next, the second mold layer 24 may be removed. Accordingly, the bottom surface of the upper supporting pattern US, portions of the side surfaces of the bottom electrodes BE, and the top surface of the lower supporting layer 22 may be exposed. The process of removing the second mold layer 24 may include an isotropic etching process. The capping pattern CP may prevent upper portions of the bottom electrodes BE from being removed or damaged by the isotropic etching process.

Figure 16:
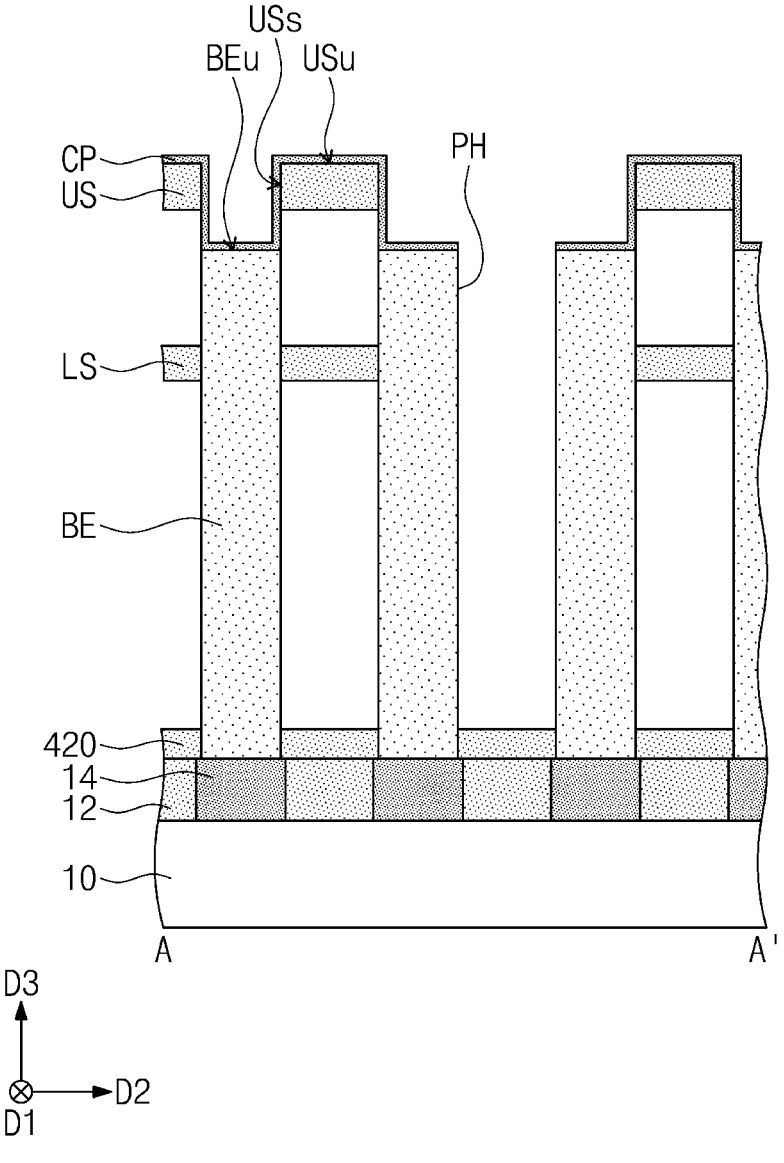

Referring to FIG. 16, portions of the lower supporting layer 22, which are vertically overlapped with the penetration holes PH, may be etched to expose portions of the top surface of the first mold layer 20. A remaining portion of the lower supporting layer 22 may form the lower supporting pattern LS.

Thereafter, the first mold layer 20 may be removed. Accordingly, a bottom surface of the lower supporting pattern LS, a remaining portion of the side surfaces of the bottom electrodes BE, and a top surface of the etch stop pattern 420 may be exposed. In an embodiment, the process of removing the first mold layer 20 may include an isotropic etching process. The capping pattern CP may prevent the bottom electrodes BE from being removed or damaged by the isotropic etching process.

The bottom electrodes BE may be supported by the capping pattern CP and the lower supporting pattern LS and thus may not be collapsed. For example, the capping pattern CP may support upper portions of the bottom electrodes BE, and the lower supporting pattern LS may support lower portions of the bottom electrodes BE. The capping pattern CP may be in direct contact with the bottom electrodes BE and the upper supporting pattern US, which are spaced apart from each other, and thus, a supporting force from the upper supporting pattern US may be exerted on the bottom electrodes BE through the capping pattern CP.

Referring back to FIG. 3, the dielectric layer DL may conformally cover the upper supporting pattern US, the lower supporting pattern LS, the bottom electrodes BE, the etch stop pattern 420, and the capping pattern CP. The dielectric layer DL may be provided to partially fill the penetration holes PH. The dielectric layer DL may be formed to enclose the capping pattern CP provided between the upper supporting pattern US and the bottom electrodes BE.

The top electrode TE may be formed on the dielectric layer DL. The top electrode TE may fill remaining portions of the penetration holes PH and may cover the top surfaces BEu of the bottom electrodes BE. The top electrode TE may be formed to fill spaces between the bottom electrodes BE, between the upper and lower supporting patterns US and LS, and between the lower supporting pattern LS and the etch stop pattern 420.

Figure 17:
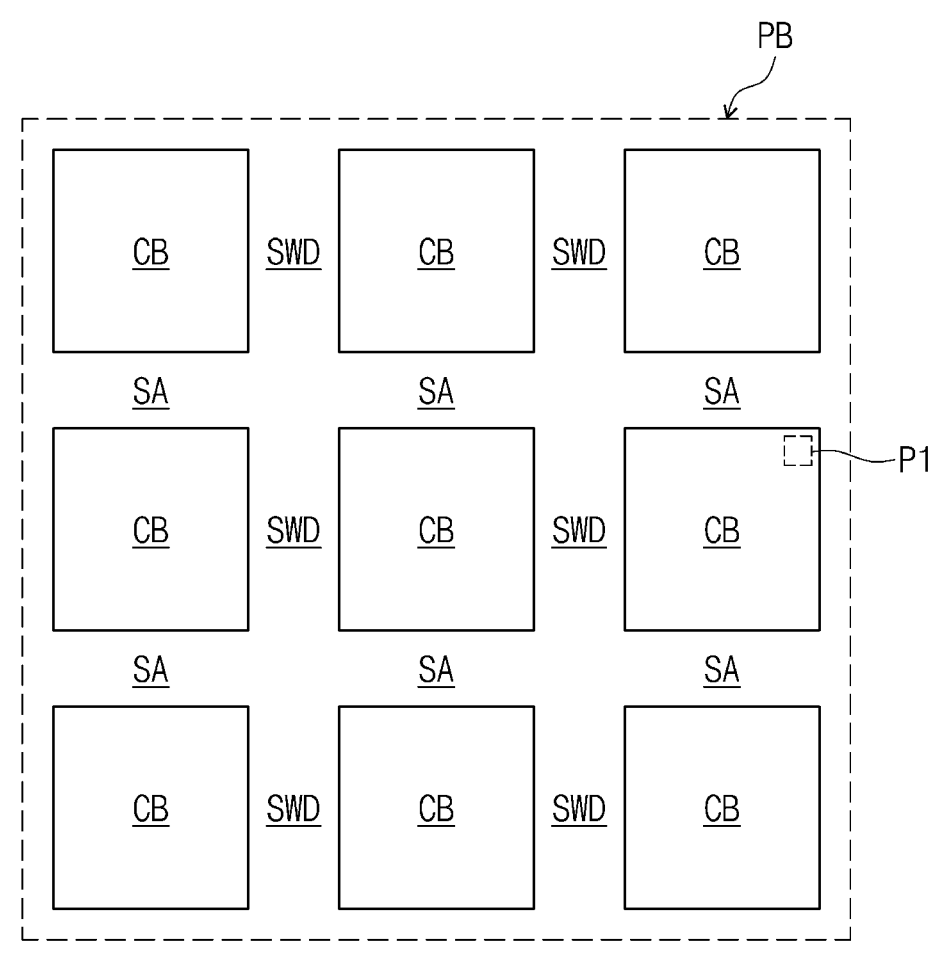
FIG. 17 is a block diagram illustrating a semiconductor device according to an embodiment of the present inventive concept.
Figure 17:
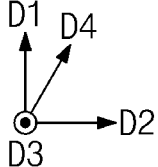
Figure 18:
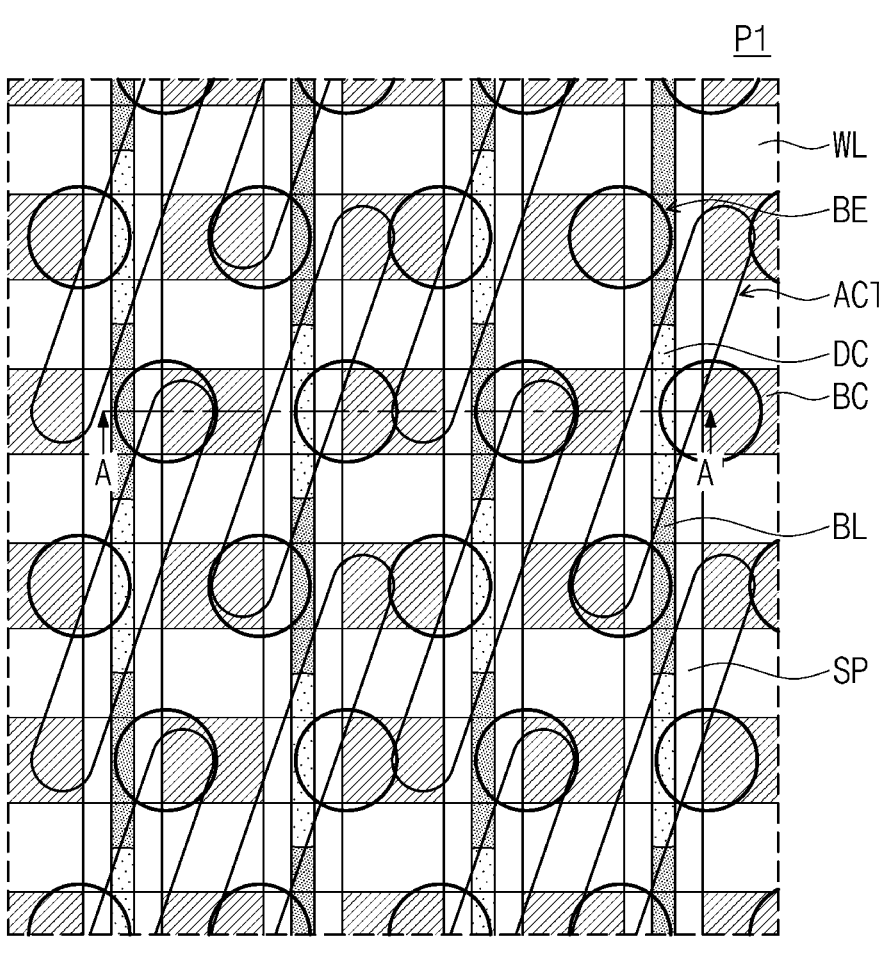
FIG. 18 is an enlarged plan view corresponding to a portion P1 of FIG. 17 according to an embodiment of the present inventive concept.
Figure 18:
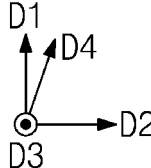
Figure 19:
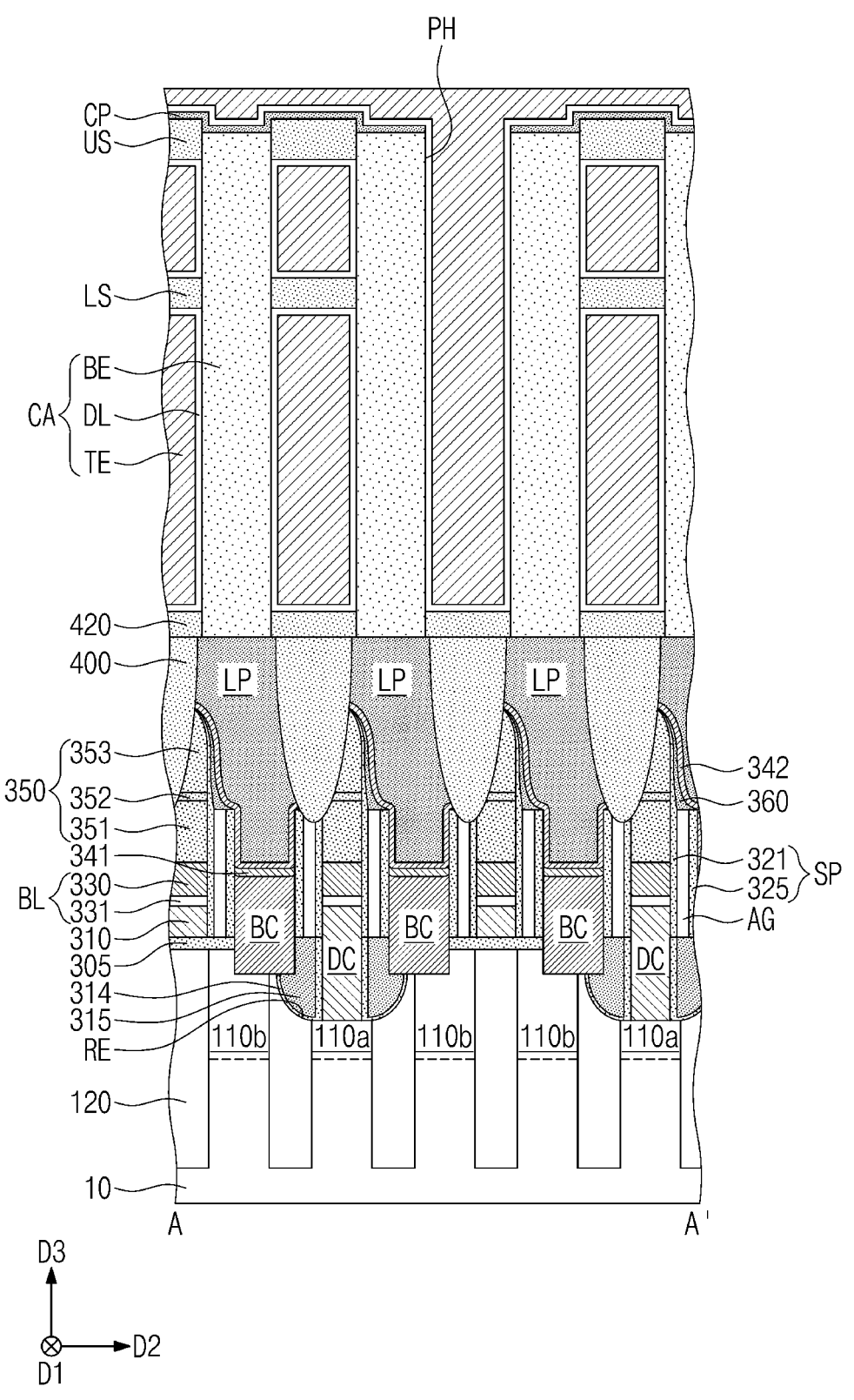
FIG. 19 is a cross-sectional view taken along a line A-A' of FIG. 18 according to an embodiment of the present inventive concept.

FIG. 17 is a block diagram illustrating a semiconductor device according to an embodiment of the present inventive concept. FIG. 18 is an enlarged plan view corresponding to a portion P1 of FIG. 17. FIG. 19 is a cross-sectional view taken along a line A-A' of FIG. 18. For concise description, a previously described element may be identified by the same reference number without repeating an overlapping description thereof.

Referring to FIG. 17, a semiconductor device may include cell blocks CB and a peripheral block PB, which is arranged to enclose each of the cell blocks CB. For example, the peripheral block PB may surround each of the cell blocks CB (e.g., in the first and second directions D1, D2). In an embodiment, the semiconductor device may be a memory device, and each of the cell blocks CB may include a cell circuit (e.g., a memory integrated circuit). The cell blocks CB may be spaced apart from each other in a first direction D1 and a second direction D2, which cross each other. For example, the first and second directions D1, D2 may be perpendicular to each other.

The peripheral block PB may include various peripheral circuits, which are used to operate the cell circuit, and the peripheral circuits may be electrically connected to the cell circuit. In an embodiment, the peripheral block PB may include sense amplifier circuits SA and sub-word line driver circuits SWD. In an embodiment, the sense amplifier circuits SA may be arranged to face each other with the cell blocks CB interposed therebetween (e.g., in the first direction D1), and the sub-word line driver circuits SWD may be provided to face each other with the cell blocks CB interposed therebetween (e.g., in the second direction D2). In an embodiment, the peripheral block PB may further include power and ground circuits for driving a sense amplifier. However, embodiments of the present inventive concept are not necessarily limited thereto.

Referring to FIGS. 18 and 19, a substrate 10 including a cell region may be provided. The cell region may be a region of the substrate 10, in which each cell block CB of FIG. 17 is disposed. In an embodiment, the substrate 10 may be a silicon substrate, a germanium substrate, or a silicon-germanium substrate. However, embodiments of the present inventive concept are not necessarily limited thereto.

Active patterns ACT may be disposed on the cell region of the substrate 10. When viewed in a plan view, the active patterns ACT may be spaced apart from each other in the first and second directions D1 and D2. In an embodiment, the active patterns ACT may be bar-shaped patterns, which are extended in a fourth direction D4 that is parallel to the top surface of the substrate 10 and is inclined with respect to the first and second directions D1 and D2. An end portion of one of the active patterns ACT may be positioned near a center of another active pattern ACT adjacent thereto in the second direction D2. Each of the active patterns ACT may be a protruding portion of the substrate 10 that is extended from the substrate 10 in a third direction D3.

Device isolation layers 120 may be disposed between the active patterns ACT. The device isolation layers 120 may be disposed in the substrate 10 to define the active patterns ACT. In an embodiment, the device isolation layers 120 may be formed of or include at least one of silicon oxide, silicon nitride, and/or silicon oxynitride. However, embodiments of the present inventive concept are not necessarily limited thereto.

Word lines WL may be disposed in the substrate 10 to cross the active patterns ACT and the device isolation layers 120. The word lines WL may be disposed in grooves, which are formed in the active patterns ACT and the device isolation layers 120. In an embodiment, the word lines WL may extend in the second direction D2 and may be spaced apart from each other in the first direction D1. The word lines WL may be buried in the substrate 10.

Impurity regions may be provided in (e.g., arranged in) the active patterns ACT. The impurity regions may include first impurity regions 110a and second impurity regions 110b. The second impurity regions 110b may be respectively provided in opposite ends of each of the active patterns ACT. Each of the first impurity regions 110a may be formed in a portion (e.g., between the second impurity regions 110b) of a corresponding one of the active patterns ACT. The first and second impurity regions 110a and 110b may contain impurities of the same conductivity type (e.g., n-type).

A buffer pattern 305 may be disposed on the cell region of the substrate 10. The buffer pattern 305 may cover the active patterns ACT, the device isolation layers 120, and the word lines WL. In an embodiment, the buffer pattern 305 may be formed of or include at least one of silicon oxide, silicon nitride, and/or silicon oxynitride.

Bit lines BL may be disposed on the substrate 10. The bit lines BL may extend in the first direction D1 and may be spaced apart from each other in the second direction D2. In an embodiment, each of the bit lines BL may include a first ohmic pattern 331 and a metal-containing pattern 330, which are sequentially stacked (e.g., in the third direction D3). The first ohmic pattern 331 may be formed of or include at least one of metal silicide materials. The metal-containing pattern 330 may be formed of or include at least one of metallic materials (e.g., tungsten, titanium, tantalum, etc.).

Polysilicon patterns 310 may be interposed between the bit lines BL and the buffer pattern 305.

Bit line contacts DC may be respectively interposed between the bit lines BL and the first impurity regions 110a (e.g., in the third direction D3). The bit lines BL may be electrically connected to the first impurity regions 110a by the bit line contacts DC. In an embodiment, the bit line contacts DC may be formed of or include doped or undoped polysilicon.

The bit line contacts DC may be disposed in recess regions RE. The recess region RE may be provided in upper portions of the first impurity regions 110a and the device isolation layers 120, which are adjacent to each other. A first gapfill insulating pattern 314 and a second gapfill insulating pattern 315 may be arranged to fill a remaining portion of the recess region RE.

A bit line capping pattern 350 may be disposed on a top surface of each of the bit lines BL. The bit line capping pattern 350 may be disposed on each of the bit lines BL to extend in the first direction D1, and adjacent ones of the bit line capping pattern 350 may be spaced apart from each other in the second direction D2. In an embodiment, the bit line capping pattern 350 may include a first bit line capping pattern 351, a second bit line capping pattern 352, and a third bit line capping pattern 353. The bit line capping pattern 350 may be formed of or include silicon nitride. In an embodiment, the first bit line capping pattern 351, the second bit line capping pattern 352, and the third bit line capping pattern 353 may be formed of or include silicon nitride. However, embodiments of the present inventive concept are not necessarily limited thereto.

A bit line spacer SP may be arranged to cover a side surface of each of the polysilicon patterns 310, an upper side surface of each of the bit line contacts DC, a side surface of each of the bit lines BL, and a side surface of the bit line capping pattern 350. The bit line spacer SP may extend along each of the bit lines BL (e.g., in the first direction D1).

In an embodiment, the bit line spacer SP may include a first sub-spacer 321 and a second sub-spacer 325, which are spaced apart from each other (e.g., in the second direction D2). In an embodiment, the first sub-spacer 321 and the second sub-spacer 325 may be spaced apart from each other by an air gap AG. However, embodiments of the present inventive concept are not necessarily limited thereto. The first sub-spacer 321 may be disposed to be in direct contact with the side surface of each of the bit lines BL and may extend to cover the side surface of the bit line capping pattern 350. The second sub-spacer 325 may be disposed along a side surface of the first sub-spacer 321. In an embodiment, the first and second sub-spacers 321 and 325 may be formed of or include at least one of silicon nitride, silicon oxide, or silicon oxynitride and may have a single- or multi-layered structure. However, embodiments of the present inventive concept are not necessarily limited thereto. The first and second sub-spacers 321 and 325 may be formed of or include the same material.

A fourth capping pattern 360 may be arranged to cover the side surface of the first sub-spacer 321 and may extend to cover a top surface of the second sub-spacer 325. The fourth capping pattern 360 may further cover the air gap AG.

Storage node contacts BC may be disposed on the substrate 10 and may be interposed between adjacent ones of the bit lines BL. The bit line spacer SP may be interposed between the storage node contacts BC and the bit lines BL which are spaced apart from each other. The storage node contacts BC may be spaced apart from each other in the first and second directions D1 and D2. Each of the storage node contacts BC may be electrically connected to a corresponding one of the second impurity regions 110b. In an embodiment, the storage node contacts BC may be formed of or include doped or undoped polysilicon. However, embodiments of the present inventive concept are not necessarily limited thereto.

A second ohmic pattern 341 may be disposed on each of the storage node contacts BC. In an embodiment, the second ohmic pattern 341 may be formed of or include at least one of metal silicide materials. However, embodiments of the present inventive concept are not necessarily limited thereto.

A diffusion-prevention pattern 342 may be arranged to conformally cover the second ohmic pattern 341, the bit line spacer SP, and the bit line capping pattern 350. The diffusion-prevention pattern 342 may be formed of or include at least one of metal nitride materials (e.g., titanium nitride and tantalum nitride). The second ohmic pattern 341 may be interposed between the diffusion-prevention pattern 342 and each of the storage node contacts BC.

Landing pads LP may be disposed on the storage node contacts BC, respectively (e.g., in the third direction D3). Each of the landing pads LP may be electrically connected to a corresponding one of the storage node contacts BC. In an embodiment, the landing pads LP may be formed of or include at least one of metal-containing materials (e.g., tungsten). An upper portion of the landing pad LP may be shifted (e.g., offset) from the storage node contact BC in the second direction D2. When viewed in a plan view, the landing pads LP may be spaced apart from each other in the first and second directions D1 and D2. As an example, the landing pads LP may be spaced apart from each other in the first and second directions D1 and D2 or may be arranged in a zigzag shape. In an embodiment, the landing pads LP may correspond to the conductive contacts 14 of FIGS. 2 and 3.

A filling pattern 400 may be arranged to enclose each of the landing pads LP. The filling pattern 400 may be interposed between adjacent ones of the landing pads LP. As an example, in an embodiment the filling pattern 400 may be formed of or include at least one of silicon nitride, silicon oxide, or silicon oxynitride. However, embodiments of the present inventive concept are not necessarily limited thereto. For example, in an embodiment the filling pattern 400 may include an empty region. The filling pattern 400 may correspond to the interlayer insulating layer 12 of FIGS. 2 and 3.

An etch stop pattern 420 may be disposed on the filling pattern 400 (e.g., in the third direction D3). The etch stop pattern 420 may be arranged to expose top surfaces of the landing pads LP, and bottom electrodes BE may be disposed on the top surfaces of the landing pads LP, respectively. Each of the bottom electrodes BE may be electrically connected to a corresponding one of the landing pads LP.

At least one supporting pattern may be disposed on the substrate 10. The supporting pattern may include the upper and lower supporting patterns US and LS, which are spaced apart from each other in the third direction D3. When viewed in a plan view, the supporting pattern may be interposed between adjacent ones of the bottom electrodes BE. Top surfaces BEu of the bottom electrodes BE may be positioned at a height that is lower than a top surface USu of the upper supporting pattern US. As an example, as shown in FIG. 19, the top surfaces BEu of the bottom electrodes BE may be positioned at a height that is higher than the bottom surface of the upper supporting pattern US. However, embodiments of the present inventive concept are not necessarily limited thereto. For example, in an embodiment as shown in FIG. 3, the top surfaces BEu of the bottom electrodes BE may be positioned at a height that is lower than the bottom surface of the upper supporting pattern US.

A top electrode TE may be arranged to cover the bottom electrodes BE and the supporting pattern. A dielectric layer DL may be interposed between the bottom electrodes BE and the top electrode TE and between the supporting pattern and the top electrode TE. A capping pattern CP may be interposed between the top surfaces BEu of the bottom electrodes BE and the dielectric layer DL and between the upper supporting pattern US and the dielectric layer DL. The capping pattern CP may be arranged to cover at least a portion of a side surface USs of the upper supporting pattern US and may extend to cover the top surface USu of the upper supporting pattern US and the top surfaces BEu of the bottom electrodes BE. The bottom electrodes BE, the dielectric layer DL, and the top electrode TE may constitute a capacitor CA.

The etch stop pattern 420, the bottom electrodes BE, the upper supporting pattern US, the lower supporting pattern LS, the capping pattern CP, the dielectric layer DL, and the top electrode TE may be configured to have substantially the same features as those described with reference to FIGS. 1 to 3.

According to an embodiment of the present inventive concept, when an isotropic etching process is performed on the first and second mold layers 20 and 24, the capping pattern CP may prevent upper portions of the bottom electrodes BE from being damaged by the isotropic etching process. Accordingly, it may be possible to prevent performance of the capacitor CA from being deteriorated and thereby to increase electric characteristics of a semiconductor device.

Furthermore, according to a conventional process of forming the bottom electrodes BE, the top surfaces BEu of the bottom electrodes BE may be positioned at a height lower than the bottom surface of the upper supporting pattern US, and in this comparative embodiment the bottom electrodes BE may not be supported by the upper supporting pattern US. Since the bottom electrodes BE have a high aspect ratio, the bottom electrodes BE may be bent or collapsed after or during a process of removing the first and second mold layers 20 and 24. By contrast, according to an embodiment of the present inventive concept, even when the top surfaces BEu of the bottom electrodes BE are located at a height lower than the bottom surface of the upper supporting pattern US, the capping pattern CP may be in direct contact with both of the bottom electrode BE and the upper supporting pattern US and thus may be used to effectively support the bottom electrodes BE. Thus, it may be possible to reduce a process failure in the process of forming the bottom electrodes BE and thereby to increase a production yield of the semiconductor device.

According to an embodiment of the present inventive concept, a capping pattern may be used to prevent bottom electrodes from being damaged in a process of etching a mold layer. As a result, it may be possible to increase electric characteristics of a semiconductor device.

In addition, even when top surfaces of bottom electrodes are positioned at a level lower than a bottom surface of an upper supporting pattern, the capping pattern, along with the upper supporting pattern, may be used to support the bottom electrodes. Accordingly, it may be possible to reduce a process failure, in which the bottom electrodes are collapsed, and thereby to increase a production yield of a semiconductor device.

While non-limiting, example embodiments of the present inventive concept have been particularly shown and described, it will be understood by one of ordinary skill in the art that variations in form and detail may be made therein without departing from the spirit and scope of the present inventive concept.

What is claimed is:

1. A semiconductor device, comprising:
   bottom electrodes on a substrate;
   a supporting pattern disposed between the bottom electrodes in a plan view;
   a top electrode covering the bottom electrodes and the supporting pattern;
   a dielectric layer disposed between the bottom electrodes and the top electrode and between the supporting pattern and the top electrode; and
   a capping pattern interposed between the bottom electrodes and the dielectric layer and between the supporting pattern and the dielectric layer,
   wherein the capping pattern directly contacts at least a portion of a side surface of the supporting pattern, a top surface of the supporting pattern, and top surfaces of the bottom electrodes, and does not directly contact side surfaces of the bottom electrodes,
   wherein the top surfaces of the bottom electrodes are separated from the dielectric layer by the capping pattern,
   wherein the dielectric layer is in contact with the side surfaces of the bottom electrodes, and
   wherein a thickness of the capping pattern is smaller than a thickness of the supporting pattern.

2. The semiconductor device of claim 1, wherein the capping pattern comprises a material having an etch selectivity with respect to the bottom electrodes.

3. The semiconductor device of claim 1, wherein the capping pattern comprises a material having an etch selectivity with respect to silicon oxide.

4. The semiconductor device of claim 1, wherein the capping pattern comprises at least one compound selected from silicon nitride, polysilicon, and SiCN.

5. The semiconductor device of claim 1, wherein a thickness of the capping pattern is in a range of about 1 nm to about 50 nm.

6. The semiconductor device of claim 1, wherein the bottom electrodes and the supporting pattern are vertically overlapped with the capping pattern.

7. The semiconductor device of claim 1, wherein each of the bottom electrodes has a pillar shape.

8. The semiconductor device of claim 1, wherein:

the supporting pattern comprises a plurality of supporting patterns positioned at different heights from each other; and the capping pattern covers at least a portion of a side surface of an uppermost supporting pattern of the plurality of supporting patterns.

9. The semiconductor device of claim 1, wherein the top surfaces of the bottom electrodes are positioned at a height that is lower than the top surface of the supporting pattern.

10. The semiconductor device of claim 1, wherein the supporting pattern is in direct contact with side surfaces of the bottom electrodes.

11. The semiconductor device of claim 1, wherein the capping pattern is interposed between the dielectric layer and the top surface of the supporting pattern and between the dielectric layer and the top surfaces of the bottom electrodes.

12. The semiconductor device of claim 1, wherein the capping pattern covers an entirety of the side surface of the supporting pattern.

13. The semiconductor device of claim 12, wherein the top surfaces of the bottom electrodes are positioned at a height that is lower than a bottom surface of the supporting pattern.

14. The semiconductor device of claim 12, wherein the supporting pattern is vertically spaced apart from the bottom electrodes.

15. A semiconductor device, comprising:

bottom electrodes on a substrate;

a supporting pattern disposed between the bottom electrodes in a plan view;

a top electrode covering the bottom electrodes and the supporting pattern;

a dielectric layer disposed between the bottom electrodes and the top electrode and between the supporting pattern and the top electrode; and a capping pattern interposed between top surfaces of the bottom electrodes and the dielectric layer and between a top surface of the supporting pattern and the dielectric layer, wherein the top surfaces of the bottom electrodes are positioned at a height that is lower than the top surface of the supporting pattern, wherein the top surfaces of the bottom electrodes are separated from the dielectric layer by the capping pattern, wherein the dielectric layer is in contact with side surfaces of the bottom electrodes, wherein a portion of the capping pattern interposed between the top surfaces of the bottom electrodes and the dielectric layer is closer to the substrate than a portion of the capping pattern interposed between the top surface of the supporting pattern and the dielectric layer, and wherein the capping pattern directly contacts at least a portion of a side surface of the supporting pattern, the top surface of the supporting pattern, and the top surfaces of the bottom electrodes, and does not directly contact the side surfaces of the bottom electrodes.

16. The semiconductor device of claim 15, wherein the top surfaces of the bottom electrodes are positioned at a height that is lower than a bottom surface of the supporting pattern.

17. The semiconductor device of claim 15, wherein the bottom electrodes and the supporting pattern are vertically overlapped with the capping pattern.

18. A semiconductor device, comprising:

a substrate including an active pattern;

an impurity region arranged in the active pattern;

a word line disposed in the substrate, the word line extending to cross the active pattern;

a bit line disposed on the substrate, the bit line extending in a direction that crosses the word line;

a storage node contact disposed on the substrate, the storage node contact is electrically connected to the impurity region;

a landing pad electrically connected to the storage node contact;

a bottom electrode electrically connected to the landing pad;

an upper supporting pattern and a lower supporting pattern disposed between the bottom electrode and an adjacent bottom electrode in a plan view;

a top electrode covering the bottom electrode and the upper supporting pattern;

a dielectric layer disposed between the bottom electrode and the top electrode and between the upper supporting pattern and the top electrode; and a capping pattern interposed between a top surface of the bottom electrode and the dielectric layer and between a top surface of the upper supporting pattern and the dielectric layer, wherein the capping pattern directly contacts at least a portion of a side surface of the upper supporting pattern, the top surface of the upper supporting pattern, and the top surface of the bottom electrode, and does not directly contact side surfaces of the bottom electrodes, wherein the top surfaces of the bottom electrodes are separated from the dielectric layer by the capping pattern, wherein the dielectric layer is in contact with the side surfaces of the bottom electrodes, and wherein a thickness of the capping pattern is smaller than a thickness of the supporting pattern.

19. The semiconductor device of claim 18, wherein the top surface of the bottom electrode is positioned at a height that is lower than the top surface of the upper supporting pattern.

* * * * *